United States Patent
Mahajan, Jr. et al.

(10) Patent No.: US 10,854,355 B2
(45) Date of Patent: Dec. 1, 2020

(54) METHOD OF MAKING A STRETCHABLE CONDUCTOR

(71) Applicant: 3M INNOVATIVE PROPERTIES COMPANY, St. Paul, MN (US)

(72) Inventors: Ankit Mahajan, Jr., Inver Grove Heignts, MN (US); James Zhu, Woodbury, MN (US); Saagar A. Shah, Minneapolis, MN (US); Mikhail L. Pekurovsky, Bloomigton, MN (US); Vivek Krishnan, St. Paul, MN (US); Kevin T. Reddy, Minneapolis, MN (US); Christopher B. Walker, Jr., St. Paul, MN (US); Michael A. Kropp, Cottage Grove, MN (US); Kara A. Meyers, Oakdale, MN (US); Teresa M. Goeddel, St. Paul, MN (US); Thomas J. Metzler, St. Paul, MN (US); Jonathan W. Kemling, Woodbury, MN (US); Roger W. Barton, Afton, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/621,021

(22) PCT Filed: Jun. 7, 2018

(86) PCT No.: PCT/IB2018/054105
§ 371 (c)(1),
(2) Date: Dec. 10, 2019

(87) PCT Pub. No.: WO2018/229609
PCT Pub. Date: Dec. 20, 2018

(65) Prior Publication Data
US 2020/0105440 A1    Apr. 2, 2020

Related U.S. Application Data

(60) Provisional application No. 62/518,519, filed on Jun. 12, 2017, provisional application No. 62/610,536, filed on Dec. 27, 2017.

(51) Int. Cl.
*H01K 3/10* (2006.01)
*H01B 7/06* (2006.01)
(Continued)

(52) U.S. Cl.
CPC ............. *H01B 7/06* (2013.01); *H01B 7/0225* (2013.01); *H01B 13/008* (2013.01); *H01B 13/0013* (2013.01); *Y10T 29/49162* (2015.01)

(58) Field of Classification Search
CPC .... H01B 7/06; H01B 13/0013; H01B 13/008; H05K 3/007; Y10T 29/49155; Y10T 29/49158; Y10T 29/49162
(Continued)

(56) References Cited

U.S. PATENT DOCUMENTS 3,324,014 A * 6/1967 Modjeska ............... G03F 7/092
29/848
4,520,562 A * 6/1985 Sado ...................... B29C 70/72
174/117 F
(Continued)

FOREIGN PATENT DOCUMENTS

CN          206040253         3/2017
EP          0138465           4/1985
(Continued)

OTHER PUBLICATIONS

International Search report for PCT International Application No. PCT/IB2018/054105 dated Sep. 7, 2018, 4 pages.

*Primary Examiner* — Donghai D Nguyen
(74) *Attorney, Agent, or Firm* — James A. Baker

(57) ABSTRACT

A stretchable conductor includes a substrate with a first major surface and an elongate wire, wherein the substrate is an elastomeric material, the elongate wire is on the first major surface of the substrate, the wire includes a first end and a second end, and further includes at least one arcuate region between the first end and the second end. At least one portion of the arcuate region of the wire in the region has a first surface area portion embedded in the surface of the substrate and a second surface area portion unembedded on the substrate and exposed in an amount sufficient to render at least an area of the substrate in the region electrically conductive. The unembedded second surface portion of the arcuate region may lie above or below a plane of the substrate. Additionally, different methods of preparing said stretchable conductor are disclosed. Composite articles including said stretchable conductor in durable electrical contact with a conductive fabric are also disclosed.

4 Claims, 16 Drawing Sheets

(51) Int. Cl.
*H01B 7/02* (2006.01)
*H01B 13/00* (2006.01)
*H01B 13/008* (2006.01)

(58) Field of Classification Search
USPC .......... 29/846, 848, 868, 33 F, 850; 174/254
See application file for complete search history.

(56) References Cited

U.S. PATENT DOCUMENTS

| | | | |
|---|---|---|---|
| 4,546,155 | A | 10/1985 | Hirose |
| 5,077,376 | A | 12/1991 | Dooley |
| 5,430,112 | A | 7/1995 | Sakata |
| 6,322,236 | B1 | 11/2001 | Campbell |
| 6,354,709 | B1 | 3/2002 | Campbell |
| 7,265,298 | B2 * | 9/2007 | Maghribi ............. A61N 1/0551 |
| | | | 174/254 |
| 7,328,638 | B2 | 2/2008 | Gardiner |
| 7,902,095 | B2 | 3/2011 | Hassonjee |
| 8,207,473 | B2 * | 6/2012 | Axisa ................... H05K 1/0283 |
| | | | 174/254 |
| 9,247,637 | B2 * | 1/2016 | Hsu ....................... H05K 1/0271 |
| 10,194,861 | B2 * | 2/2019 | Okumura ............... H05K 1/028 |
| 2004/0192082 | A1 * | 9/2004 | Wagner .................... H05K 1/11 |
| | | | 439/67 |
| 2009/0166877 | A1 | 7/2009 | Lifka |
| 2012/0178317 | A1 | 7/2012 | Skidmore |
| 2014/0104793 | A1 * | 4/2014 | Park ....................... H05K 1/0283 |
| | | | 361/749 |
| 2014/0340857 | A1 * | 11/2014 | Hsu ...................... A61B 5/6846 |
| | | | 361/749 |
| 2017/0053873 | A1 | 2/2017 | Zhu |
| 2017/0094774 | A1 | 3/2017 | Elsherbini |
| 2017/0135416 | A1 | 5/2017 | Kang |

FOREIGN PATENT DOCUMENTS

| | | |
|---|---|---|
| EP | 0193068 | 9/1986 |
| GB | 1121196 | 7/1968 |
| KR | 20100131593 | 12/2010 |
| WO | WO 2000-48037 | 8/2000 |

* cited by examiner

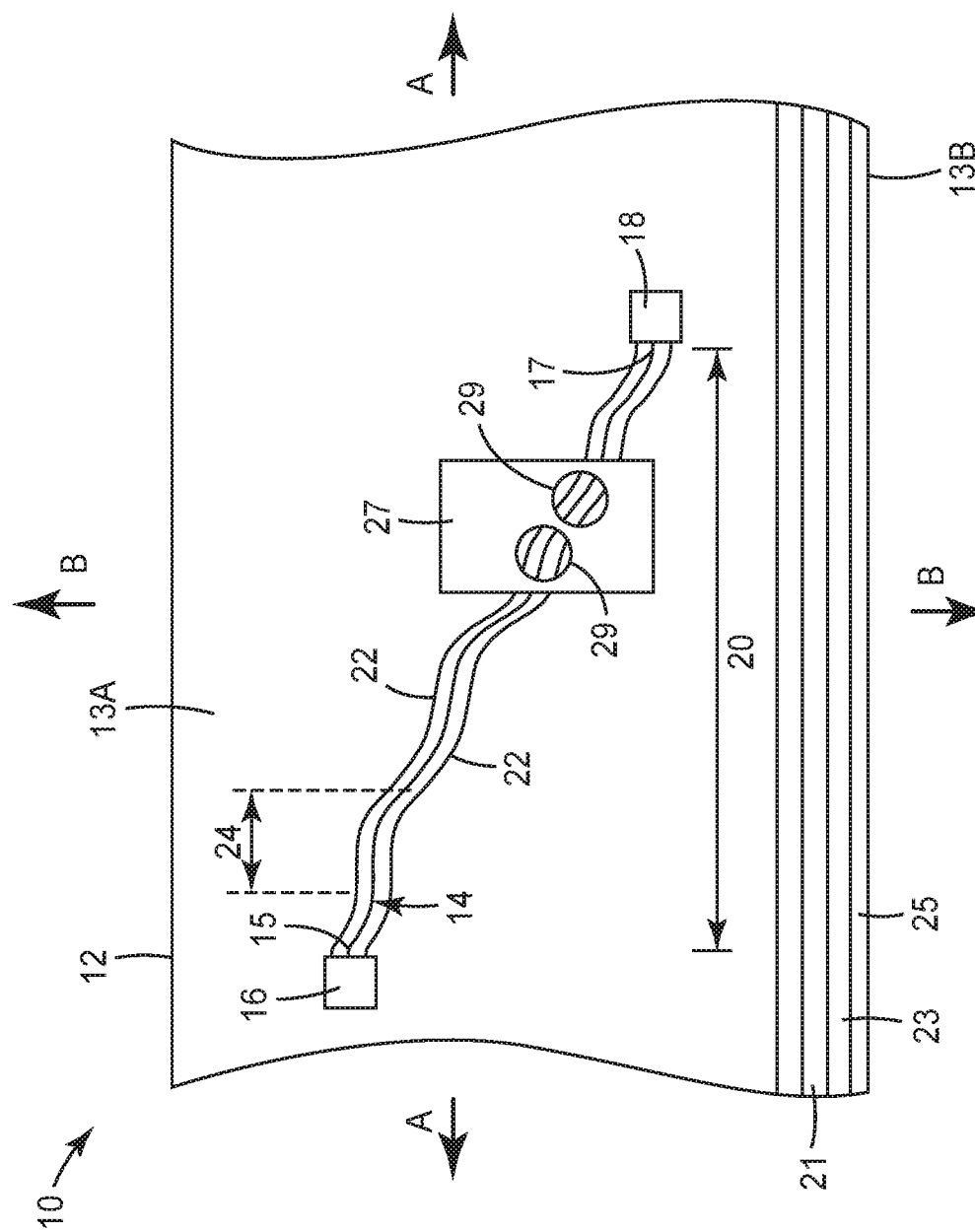

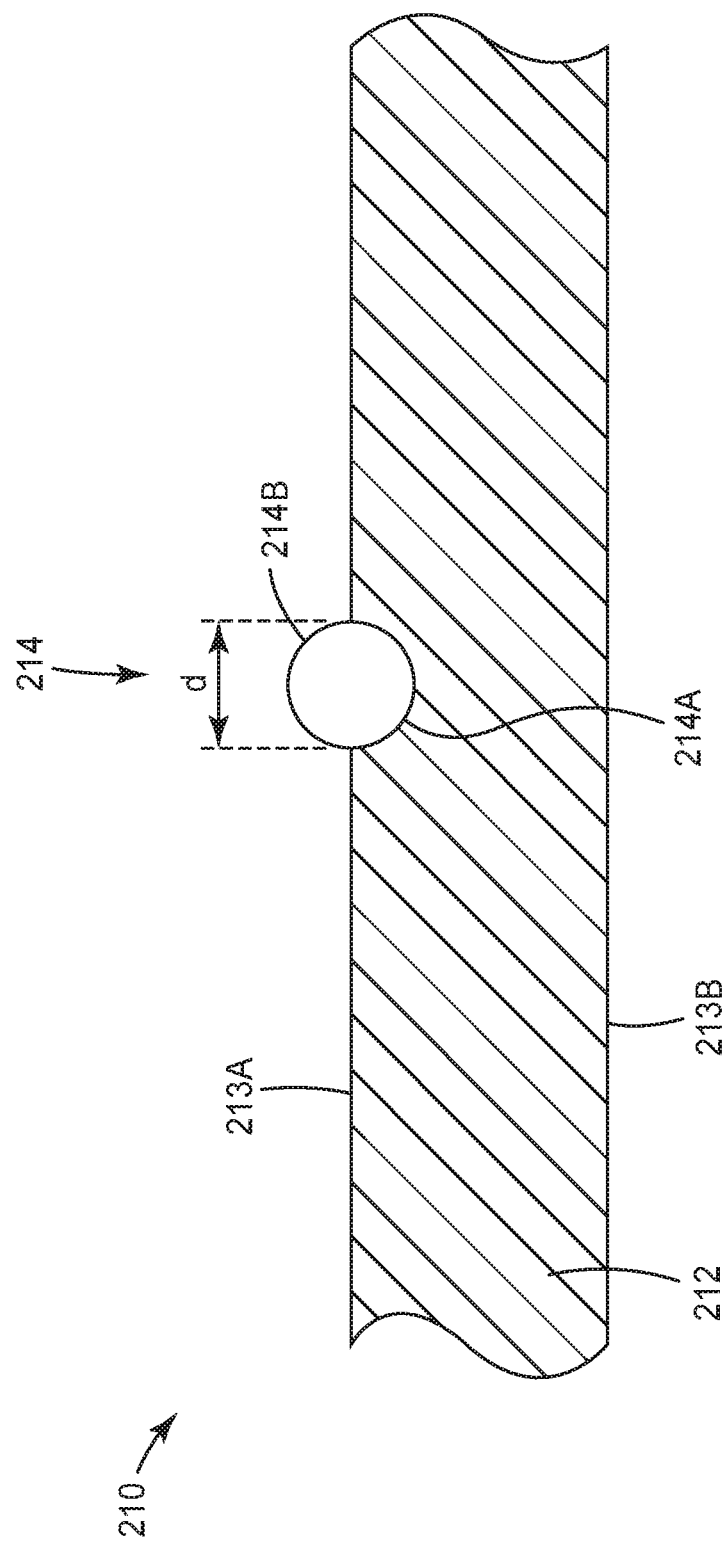

FIG. 7
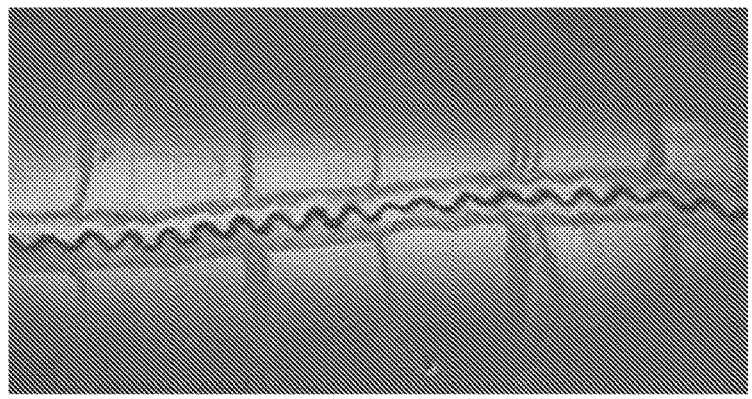
FIG. 8
 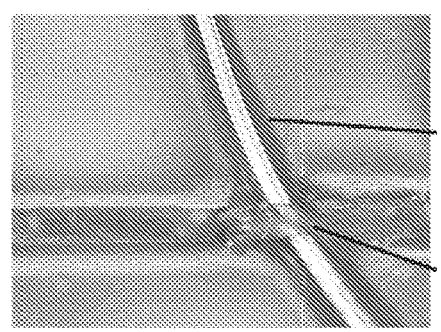
FIG. 9A        FIG. 9B

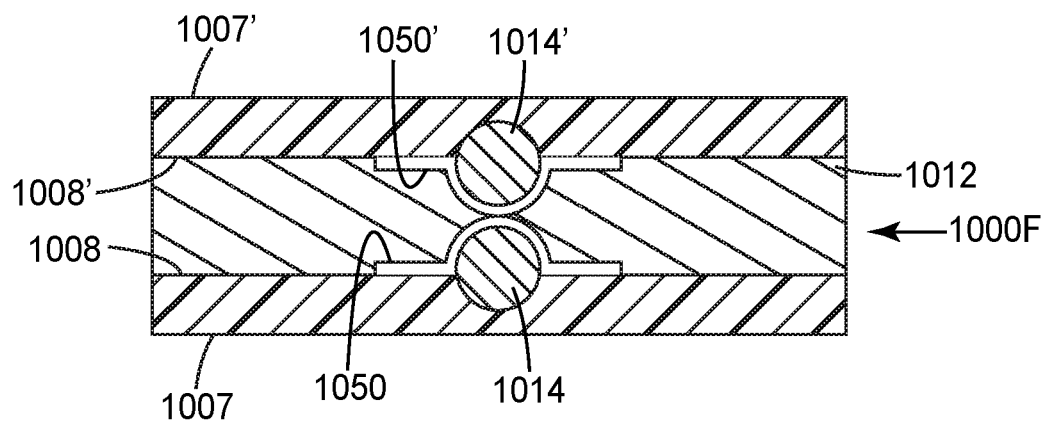
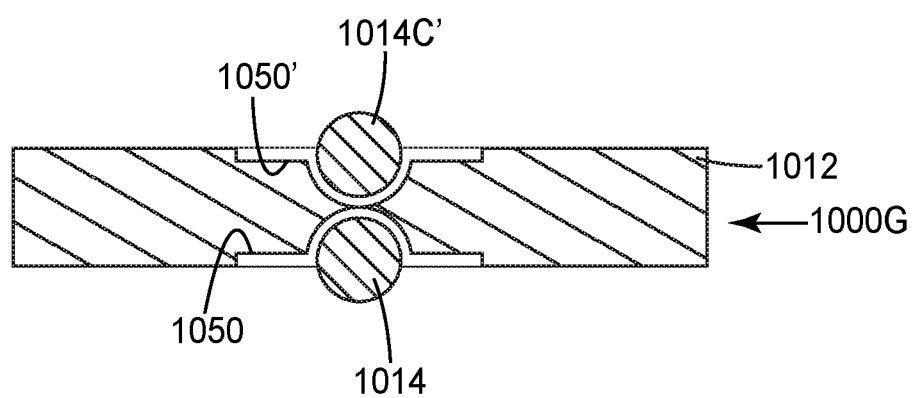
FIG. 10, cont.

METHOD OF MAKING A STRETCHABLE CONDUCTOR

CROSS REFERENCE TO RELATED APPLICATIONS

This application is a national stage filing under 35 U.S.C. 371 of PCT/IB2018/054105, filed Jun. 7, 2018, which claims the benefit of U.S. Application No. 62/518,519, filed Jun. 12, 2017, and U.S. Application No. 62/610,536, filed Dec. 27, 2017, the disclosure of which is incorporated by reference in its/their entirety herein.

BACKGROUND

Stretchable conductors can be used in conformable and wearable electronic devices. For example, a stretchable conductive film can be directly laminated to a fabric and integrated with electronic sensors and modules.

Stretchable conductive materials such as woven metallic fiber or yarn can be used in wearable electronics, but these materials can be expensive and difficult to manufacture. Printed stretchable conductive silver inks on elastomeric substrates can be made less expensively than woven metallic fibers and yarns, but do not meet stretchability and conductivity requirements for many conformable electronics applications.

SUMMARY

In general, the present disclosure is directed to elongate wires with at least one arcuate region between a first end and a second end thereof, which are partially embedded in a major surface of an elastomeric substrate. A portion of the surface area of the wire is exposed above the surface of the elastomeric substrate sufficient to provide the substrate with electrical conductivity, while the remainder of the surface area of the wire is embedded below the surface of the substrate. The portion of the surface area of the wire below the surface of the substrate remains embedded in the substrate and does not break or debond from the substrate after the substrate is subjected to mechanical bending and stretching.

Depending on the embedment depth of the arcuate wire in the elastomeric substrate, the portion of the surface area of the conductor ultimately exposed above the major surface of the substrate can be controlled, which can provide sufficient conductivity for use in wearable electronics and sensors. The arcuate wire is sufficiently embedded in the surface of the substrate such that the substrate can sustain high values of stretch without breaking, de-bonding from the substrate, or showing any noticeable degradation in electrical conductivity after a plurality of stretching cycles.

The stretchable conductors can be easily and inexpensively manufactured by partially sinking the elongate, arcuate wire in a release layer followed by overcoating at least a portion of the wire with a liquid elastomeric pre-polymer solution. The cast elastomeric film is then at least partially cured and stripped off the release layer. The wire, which adheres more strongly to the elastomeric layer than the release layer, transfers to and remains partially embedded in the elastomeric film during the stripping step. After transfer, there is no portion of the wire that remains embedded in the release layer, as all of the conductor is transferred to the elastomeric layer. Portions of the surface area of the wire remain embedded in the elastomeric layer, while portions of the surface area of the wire remain exposed on the surface of the elastomeric layer.

In one aspect, the present disclosure is directed to a stretchable conductor including: a substrate with a first major surface, wherein the substrate is an elastomeric material. An elongate wire resides on the first major surface of the substrate, and has a first end and a second end, and at least one arcuate region between the first end and the second end. At least one portion of the arcuate region of the wire in the region has a first surface area portion embedded in the surface of the substrate and a second surface area portion unembedded on the substrate and exposed in an amount sufficient to render at least an area of the substrate in the region electrically conductive.

In another aspect, the present disclosure is directed to a method of making a stretchable conductor, including: contacting a winding elongate wire with a surface of a release layer; embedding a first portion of the surface area of the wire in the surface of the release layer such that a second portion of the surface area of the wire remains unembedded in the surface of the release layer, wherein the second portion of the surface area of the wire comprises about 1% to about 80% of the total surface area of the wire; applying a layer of a liquid elastomeric precursor material onto the surface of the release layer to overlie the second portion of the surface area of the wire; converting the layer of the liquid elastomeric precursor material into a layer of elastomeric material; and separating the layer of elastomeric material from the release layer such that the wire separates from the release layer and the second portion of the surface area of the wire remains embedded in the layer of elastomeric material.

In still another aspect, the present disclosure is directed to a method of making a stretchable conductor, including: contacting an elongate wire with a surface of a release layer; applying a force to at least one of the elongate wire and the release layer; removing the force to form a serpentine region in the wire; partially embedding at least a portion of the serpentine region of the wire in the surface of the release layer, wherein a first portion of the surface area of the wire embeds in the surface of the release layer and a second portion of the surface area of the wire remains unembedded in the surface of the release layer; applying a layer of elastomeric precursor material onto the surface of the release layer to overlie the second portion of the surface area of the wire; converting the layer of the elastomeric precursor material into a layer of elastomeric material; and separating the layer of elastomeric material from the release layer such that the wire separates from the release layer and the second portion of the wire remains embedded in the layer of elastomeric material.

In yet another aspect, the present disclosure is directed to a method of making a stretchable conductor, including: contacting a randomly winding wire with a surface of a release layer; partially embedding the wire in the surface of release layer such that a first portion of a surface area of the wire remains embedded in the surface and a second portion of the surface area of the wire is exposed, wherein the second portion of the surface area of the wire comprises about 1% to about 80% of the total surface area of the elongate wire; applying a layer of elastomeric precursor material onto the surface of the release layer to overlie the second portion of the surface area of the elongate wire; converting the layer of the elastomeric precursor material into a layer of elastomeric material; and separating the layer of elastomeric material from the release layer such that the wire separates from the release layer and the second portion of the surface area of the wire remains embedded in the layer of elastomeric material.

In a further aspect, the present disclosure is directed to a stretchable conductor including a substrate with a first major surface, wherein the substrate includes an elastomeric polymeric film; an elongate braided metal wire on the first major surface of the substrate, wherein the metal wire includes a plurality of metal wire strands, a substantially circular cross-sectional shape, and includes a first end and a second end, wherein the metal wire comprises at least one serpentine region between the first end and the second end, and wherein the serpentine region of the metal wire lies on the first major surface of the substrate; the serpentine region of the metal wire including a first surface area portion embedded in the first major surface of the substrate and a second surface area portion unembedded on the substrate and exposed, wherein the second surface area portion includes about 1% to about 80% of the total surface area of the metal wire.

In an additional aspect, the present disclosure is directed to a stretchable electrical device, including: a first electrical contact and a second electrical contact, wherein the first and the second electrical contacts are on an elastomeric polymeric substrate; an electrical interconnect between the first electrical contact and the second electrical contact, wherein the electrical interconnect includes an elongate braided metal wire on a major surface of the elastomeric polymeric substrate, wherein the metal wire includes a plurality of metal wire strands and a first end and a second end, wherein the metal wire has at least one serpentine region between the first end and the second end, and wherein the serpentine region of the metal wire lies on the major surface of the substrate; the serpentine region of the metal wire including a first surface area portion embedded in the major surface of the substrate and a second surface area portion unembedded in the substrate and exposed, wherein the second surface area portion includes about 1% to about 80% of the total surface area of the metal wire.

In still another aspect, the present disclosure is directed to a method of making a stretchable conductor, including: contacting a randomly winding braided metal wire with surface structures protruding away from a surface of a structured release layer, wherein the braided metal wire includes a plurality of metal wire strands, wherein the surface structures include passivation structures, and wherein the metal wire extends on the surface of the release layer in a direction normal to the direction of the passivation structures; softening the release layer such that: in a first region of the wire between the passivation structures, a first portion of the surface area of the metal wire embeds in the surface of the release layer and a second portion of the surface area of the wire remains unembedded in the surface of the release layer, wherein the second portion of the surface area of the metal wire comprises about 1% to about 80% of the total surface area of the metal wire, and in a second region of the metal wire atop the passivation structures, the wire remains unembedded in the surface of the release layer; applying a layer of elastomeric precursor material onto the first major surface of the release layer to overlie the first and the second regions of the metal wire and enter areas between the metal wire strands; converting the layer of the elastomeric precursor material into a layer of elastomeric material; and separating the layer of elastomeric material from the release layer such that the second portion of the surface area of the metal wire remains embedded in the layer of elastomeric material, and the first portion of the surface area of the metal wire is exposed above a major surface of the layer of elastomeric material.

In a further aspect, the present disclosure is directed to a method of making a stretchable conductor, including: contacting a randomly winding braided metal wire with embossed or die cut surface structures protruding away from a surface of a structured release layer, wherein the braided metal wire includes a plurality of metal wire strands, wherein the surface structures include ribs, and wherein the metal wire extends on the surface of the release layer in a direction normal to the direction of the ribs; embedding a first portion of the surface area of the metal wire in the surface of the ribs of the release layer such that a second portion of the surface area of the wire remains unembedded in the surface of the ribs of the release layer, wherein the second portion of the surface area of the metal wire comprises about 1% to about 80% of the total surface area of the metal wire, applying a layer of elastomeric precursor material onto the first major surface of the release layer; converting the layer of the elastomeric precursor material into a layer of elastomeric material; and separating the layer of elastomeric material from the release layer such that the second portion of the surface area of the metal wire remains embedded in the layer of elastomeric material, and the first portion of the surface area of the metal wire is exposed above a major surface of the layer of elastomeric material.

In another additional aspect, the present disclosure is directed to a method of making a stretchable conductor, comprising: contacting a winding elongate wire with a surface of a release layer; embedding a first portion of the surface area of the wire in the surface of the release layer such that a second portion of the surface area of the wire remains unembedded in the surface of the release layer, wherein the second portion of the surface area of the wire comprises about 1% to about 80% of the total surface area of the wire; applying a layer of a liquid elastomeric precursor material onto the surface of the release layer to overlie the second portion of the surface area of the wire, such that a third portion of the surface area of the wire remains uncovered by the liquid elastomeric precursor; converting the layer of the liquid elastomeric precursor material into a layer of elastomeric material; and separating the layer of elastomeric material from the release layer such that the wire separates from the release layer, the second portion of the surface area of the wire remains embedded in the layer of elastomeric material, and the third portion of the surface area of the wire is not embedded in the layer of elastomeric material.

In yet another aspect, the present disclosure is directed to a method of making a stretchable conductor, comprising: preparing a first and a second subassembly by contacting a winding elongate wire with a surface of a release layer; embedding a first portion of the surface area of the wire in the surface of the release layer such that a second portion of the surface area of the wire remains unembedded in the surface of the release layer, wherein the second portion of the surface area of the wire comprises about 1% to about 80% of the total surface area of the wire; and applying a layer of a stretchable conductive film over at least a portion of the wire; applying a layer of a liquid elastomeric precursor material onto the surface of the release layer and the release layer of the first subassembly to overlie the second portion of the surface area of the wire; disposing the second subassembly within the elastomeric precursor material, with the wire of the second subassembly oriented towards the wire of the first subassembly; applying a force so as to urge the release layer of the first subassembly towards the release layer of the second subassembly, so as to cause the stretchable conductive film of the first subassembly into electrical contact with stretchable conductive film of the second subassembly; converting the layer of the liquid elastomeric precursor material into a layer of elastomeric material; and separating the layer of elastomeric material from the two release layers such that the wire separates from the release layers, the first portion of the surface area of the both wires remains embedded in the layer of elastomeric material, and the second portion of the surface area of both wires is not embedded in the layer of elastomeric material.

In a final aspect, the present disclosure provides a stretchable conductor, comprising: a substrate with a first and a second major surface, wherein the substrate comprises an elastomeric material; a first elongate wire on the first major surface of the substrate, wherein the wire comprises a first end and a second end, and wherein the wire comprises at least one arcuate region between the first end and the second end, and wherein at least one portion of the arcuate region of the first wire in the region comprises a first surface area portion embedded in the surface of the substrate and a second surface area portion unembedded on the substrate and exposed in an amount sufficient to render at least an area of the substrate in the region electrically conductive; a second elongate wire on the second major surface of the substrate, wherein the wire comprises a first end and a second end, and wherein the second wire comprises at least one arcuate region between the first end and the second end, and wherein at least one portion of the arcuate region of the wire in the region comprises a first surface area portion embedded in the surface of the substrate and a second surface area portion unembedded on the substrate and exposed in an amount sufficient to render at least an area of the substrate in the region electrically conductive; a first layer of stretchable conductive film in contact with both the first wire and the first major surface of the substrate; and a second layer of stretchable conductive film in contact with both the second wire and the second major surface of the substrate; wherein the first layer of stretchable conductive film and the second layer of stretchable conductive film are in electrical contact with each other.

The details of one or more of these aspects of the disclosed invention are summarized in the following listing of exemplary embodiments.

LISTING OF EXEMPLARY EMBODIMENTS

Embodiment A

A stretchable conductor, comprising: a substrate with a first major surface, wherein the substrate comprises an elastomeric material; an elongate wire on the first major surface of the substrate, wherein the wire comprises a first end and a second end, and wherein the wire comprises at least one arcuate region between the first end and the second end, and wherein at least one portion of the arcuate region of the wire in the region comprises a first surface area portion embedded in the surface of the substrate and a second surface area portion unembedded on the substrate and exposed in an amount sufficient to render at least an area of the substrate in the region electrically conductive.

Embodiment B

The stretchable conductor according to Embodiment A, wherein the wire comprises a metal.

Embodiment C

The stretchable conductor according to Embodiment B, wherein the wire is a drawn solid metal wire.

Embodiment D

The stretchable conductor according to Embodiment B, wherein the wire comprises a plurality of braided metal wire strands.

Embodiment E

The stretchable conductor according to Embodiment D, wherein the elastomeric material occupies an interstitial region between the strands.

Embodiment F

The stretchable conductor according to any of Embodiments A to E, wherein the arcuate region of the elongate conductor comprises a randomly winding pattern.

Embodiment G

The stretchable conductor according to any of Embodiments A to F, wherein the arcuate region comprises at least one serpentine portion.

Embodiment H

The stretchable conductor according to any of Embodiments A to G, wherein the arcuate region of the wire comprises a fractal serpentine shape.

Embodiment I

The stretchable conductor according to claim Embodiment H, wherein the arcuate region of the wire comprises a plurality of nested serpentine regions.

Embodiment J

The stretchable conductor according to any of Embodiments A to I, wherein the elastomeric material has, at room temperature, a Young's modulus of less than about 100 MPa and an elongation at break of at least about 200%.

Embodiment K

The stretchable conductor according to Embodiment J, wherein the elastomeric material has, at room temperature, a Young's modulus of less than about 10 MPa and an elongation at break of at least about 100%.

Embodiment L

The stretchable conductor according to any of Embodiments A to K, wherein the elastomeric material is chosen from natural rubber, polyurethane, polybutadiene, neoprene, epoxies, and silicones.

Embodiment M

The stretchable conductor according to Embodiment L, wherein the elastomeric material is chosen from polyurethanes, epoxies and silicones.

Embodiment N

The stretchable conductor according to Embodiment L, wherein the elastomeric material comprises an epoxy resin.

Embodiment O

The stretchable conductor according to Embodiment N, wherein the elastomeric material comprises: an epoxy resin having at least two epoxide groups per molecule; a thiol component comprising a polythiol compound having at least two primary thiol groups; a silane-functionalized adhesion promoter; a nitrogen-containing catalyst for curing the epoxy resin; and an optional cure inhibitor.

Embodiment P

The stretchable conductor according to any of Embodiments A to O, wherein the elastomeric material comprises an aliphatic polyurethane polymer comprising a plurality of soft segments and a plurality of hard segments, wherein the soft segments comprise polycarbonate polyol.

Embodiment Q

The stretchable conductor according to any of Embodiments A to P, wherein the second surface area portion comprises about 1% to about 80% of the total surface area of the wire.

Embodiment R

The stretchable conductor according to Embodiment Q, wherein the second surface area portion comprises about 20% to about 50% of the total surface area of the wire.

Embodiment S

The stretchable conductor according to any of Embodiments A to R, wherein the arcuate region of the wire resides on the first major surface of the substrate.

Embodiment T

The stretchable conductor according to any of Embodiments A to R, wherein a portion of the elongate wire lies outside a plane of the substrate, and the arcuate region resides on the first major surface of the substrate.

Embodiment U

The stretchable conductor according to any of Embodiments A to R, wherein a portion of the arcuate region lies above or below a plane of the substrate.

Embodiment V

The stretchable conductor according to any of Embodiments A to R, wherein the second surface area portion is exposed on the first major surface of the substrate.

Embodiment W

The stretchable conductor according to any of Embodiments A to R, wherein the second surface area portion is exposed on the first major surface of the substrate and on a second major surface of the substrate opposite the first major surface.

Embodiment X

The stretchable conductor according to any of Embodiments A to W, wherein the first surface is structured.

Embodiment Y

The stretchable conductor according to any of Embodiments A to X, wherein at least some regions of the wire are entirely embedded in the substrate.

Embodiment Z

The stretchable conductor according to any of Embodiments A to Y, wherein the wire comprises a braided metal wire.

Embodiment AA

The stretchable conductor according to any of Embodiments A to Z further comprising an insulative layer overlying at least a portion of the elongate wire.

Embodiment BB

The stretchable conductor according to any of Embodiments A to AA, further comprising: a second elongate wire on a second major surface of the substrate opposite the first major surface, wherein the second wire comprises a first end and a second end, and wherein the second wire comprises at least one arcuate region between the first end and the second end, wherein at least one portion of the at least one arcuate region of the second wire comprises a first surface area portion embedded in the surface of the substrate, and a second surface area portion unembedded in the surface of the substrate and exposed in an amount sufficient to render at least an area of the substrate in the at least one arcuate region of the second wire electrically conductive; a first layer of stretchable conductive film in contact with both the first wire and the first major surface of the substrate; and a second layer of stretchable conductive film in contact with both the second wire and the second major surface of the substrate; wherein the first layer of stretchable conductive film and the second layer of stretchable conductive film are in electrical contact with each other. This embodiment is exemplified by the article formed by the method depicted in FIG. 10.

Embodiment CC

A composite article, comprising: a stretchable conductor according Embodiments A to AA, a conductive fabric adhered to the first major surface of the substrate with a non-conductive adhesive, wherein the conductive fabric and the elongate wire are in electrical contact.

Embodiment DD

A composite article according to Embodiment CC, further comprising a portion of a conductive film disposed between a portion of the conductive fabric and the elongate wire.

Embodiment EE

A method of making a stretchable conductor, comprising: contacting a winding elongate wire with a surface of a release layer; embedding a first portion of the surface area of the wire in the surface of the release layer such that a second portion of the surface area of the wire remains unembedded in the surface of the release layer, wherein the second portion of the surface area of the wire comprises about 1% to about 80% of the total surface area of the wire; applying a layer of a liquid elastomeric precursor material onto the surface of the release layer to overlie the second portion of the surface area of the wire; converting the layer of the liquid elastomeric precursor material into a layer of elastomeric material; and separating the layer of elastomeric material from the release layer such that the wire separates from the release layer and the second portion of the surface area of the wire remains embedded in the layer of elastomeric material.

Embodiment FF

The method according to Embodiment EE, wherein the wire is a drawn solid metal wire.

Embodiment GG

The method according to Embodiment EE, wherein the wire comprises a plurality of strands, and the elastomeric material resides between the strands.

Embodiment HH

The method according to any of Embodiments EE to GG, wherein the surface of the release layer comprises structures.

Embodiment II

The method according to Embodiment HH, wherein the structured surface comprises a series of parallel depressions.

Embodiment JJ

The method according to any of Embodiments EE to II, wherein the elongate wire comprises at least one serpentine portion.

Embodiment KK

The method according to any of Embodiments EE to JJ, wherein the elongate wire comprises a fractal serpentine shape.

Embodiment LL

The method according to Embodiment KK, wherein the elongate wire comprises a plurality of nested serpentine regions.

Embodiment MM

The method according to any of Embodiments EE to LL, wherein the release layer comprises a polymeric film.

Embodiment NN

The method according to any of Embodiments EE to MM, wherein applying the layer of a liquid elastomeric precursor material onto the surface of the release layer to overlie the second portion of the surface area of the wire is carried out such that a third portion of the surface area of the wire remains uncovered by the liquid elastomeric precursor.

Embodiment OO

The method of Embodiments EE to NN, further comprising: applying a precursor of a non-conductive adhesive to a conductive fabric, contacting the second portion of the wire with at least a portion of the conductive fabric, and applying a pressure of at least 0.55 MPa while curing the non-conductive adhesive precursor to produce a non-conductive adhesive. This embodiment is exemplified by the method described in Example 10 and depicted in FIG. 12A Embodiment PP The method according to Embodiment OO, further comprising disposing a portion of a conductive film between a portion of conductive fabric and the wire. This embodiment is exemplified by the method described in Example 11 and depicted in FIG. 12B.

Embodiment QQ

A method of making a stretchable conductor, comprising: preparing a first and a second subassembly by (a) contacting a winding elongate wire with a surface of a release layer, (b) embedding a first portion of the surface area of the wire in the surface of the release layer such that a second portion of the surface area of the wire remains unembedded in the surface of the release layer, wherein the second portion of the surface area of the wire comprises about 1% to about 80% of the total surface area of the wire, and (c) applying a layer of a stretchable conductive film over at least a portion of the unembedded wire; applying a layer of a liquid elastomeric precursor material onto the surface of the release layer of the first subassembly to overlie the second portion of the surface area of the wire; disposing the second subassembly into contact with the liquid elastomeric precursor material, wherein the wire of the second subassembly is oriented facing the wire of the first subassembly; applying a force so as to urge the release layer of the first subassembly towards the release layer of the second subassembly so as to cause the stretchable conductive film of the first subassembly into electrical contact with the stretchable conductive film of the second subassembly; converting the layer of the liquid elastomeric precursor material into a layer of elastomeric material; and separating the layer of elastomeric material from the two release layers such that the wire separates from the release layers, the first portion of the surface area of the both wires remains embedded in the layer of elastomeric material, and the second portion of the surface area of both wires is not embedded in the layer of elastomeric material. This embodiment is exemplified by the method depicted in FIG. 10.

Embodiment RR

A method of making a stretchable conductor, comprising: contacting an elongate wire with a surface of a release layer; applying a force to at least one of the elongate wire and the release layer; removing the force to form a serpentine region in the wire; partially embedding at least a portion of the serpentine region of the wire in the surface of the release layer, wherein a first portion of the surface area of the wire embeds in the surface of the release layer and a second portion of the surface area of the wire remains unembedded in the surface of the release layer; applying a layer of elastomeric precursor material onto the surface of the release layer to overlie the second portion of the surface area of the wire; converting the layer of the elastomeric precursor material into a layer of elastomeric material; and separating the layer of elastomeric material from the release layer such that the wire separates from the release layer and the second portion of the wire remains embedded in the layer of elastomeric material.

Embodiment SS

The method according to Embodiment RR, wherein the elongate wire is a memory metal wire, the method further comprising: applying force to the memory metal wire; and removing the force to cause the memory metal wire to recoil and assume a randomly winding pattern on the surface of the release layer.

Embodiment TT

The method according to Embodiment RR, wherein the elongate wire is molded into a randomly winding pattern on the surface of the release layer.

Embodiment UU

A method of making a stretchable conductor, comprising: contacting a randomly winding wire with a surface of a release layer; partially embedding the wire in the surface of release layer such that a first portion of a surface area of the wire remains embedded in the surface and a second portion of the surface area of the wire is exposed, wherein the second portion of the surface area of the wire comprises about 1% to about 80% of the total surface area of the elongate wire; applying a layer of elastomeric precursor material onto the surface of the release layer to overlie the second portion of the surface area of the elongate wire; converting the layer of the elastomeric precursor material into a layer of elastomeric material; and separating the layer of elastomeric material from the release layer such that the wire separates from the release layer and the second portion of the surface area of the wire remains embedded in the layer of elastomeric material.

Embodiment VV

The method according to Embodiment UU, further comprising thermoforming the layer of elastomeric material having the wire embedded therein.

Embodiment WW

A stretchable conductor, comprising: a substrate with a first major surface, wherein the substrate comprises an elastomeric polymeric film; an elongate braided metal wire on the first major surface of the substrate, wherein the metal wire comprises a plurality of metal wire strands, a substantially circular cross-sectional shape, and comprises a first end and a second end, wherein the metal wire comprises at least one serpentine region between the first end and the second end, and wherein the serpentine region of the metal wire lies on the first major surface of the substrate; the serpentine region of the metal wire comprising a first surface area portion embedded in the first major surface of the substrate and a second surface area portion unembedded on the substrate and exposed, wherein the second surface area portion comprises about 1% to about 80% of the total surface area of the metal wire.

Embodiment XX

The stretchable conductor according to Embodiment WW, further comprising a layer of a polymeric film on the first major surface of the substrate.

Embodiment YY

The stretchable conductor according to Embodiment XX, wherein the layer of the polymeric film comprises an arrangement of apertures, and wherein the metal wire is exposed in the apertures.

Embodiment ZZ

The stretchable conductor according to any of Embodiments WW to YY, wherein the metal wire strands are at least partially encapsulated in the elastomeric polymeric film.

Embodiment AAA

A stretchable electrical device, comprising: a first electrical contact and a second electrical contact, wherein the first and the second electrical contacts are on an elastomeric polymeric substrate; an electrical interconnect between the first electrical contact and the second electrical contact, wherein the electrical interconnect comprises an elongate braided metal wire on a major surface of the elastomeric polymeric substrate, wherein the metal wire comprises a plurality of metal wire strands and comprises a first end and a second end, wherein the metal wire comprises at least one serpentine region between the first end and the second end, and wherein the serpentine region of the metal wire lies on the major surface of the substrate; the serpentine region of the metal wire comprising a first surface area portion embedded in the major surface of the substrate and a second surface area portion unembedded in the substrate and exposed, wherein the second surface area portion comprises about 1% to about 80% of the total surface area of the metal wire.

Embodiment BBB

The stretchable electrical device of Embodiment AAA, wherein at least one of the first electrical contact and the second electrical contact is soldered to the second surface area portion of the braided metal wire.

Embodiment CCC

The stretchable electrical device of Embodiments AAA to BBB, further comprising a soldered electrical connection to the second surface area portion of the braided electrical wire.

Embodiment DDD

A method of making a stretchable conductor, comprising: contacting a randomly winding braided metal wire with surface structures protruding away from a surface of a structured release layer, wherein the braided metal wire comprises a plurality of metal wire strands, wherein the surface structures comprise passivation structures, and wherein the metal wire extends on the surface of the release layer in a direction normal to the direction of the passivation structures; softening the release layer such that: in a first region of the wire between the passivation structures, a first portion of the surface area of the metal wire embeds in the surface of the release layer and a second portion of the surface area of the wire remains unembedded in the surface of the release layer, wherein the second portion of the surface area of the metal wire comprises about 1% to about 80% of the total surface area of the metal wire, and in a second region of the metal wire atop the passivation structures, the wire remains unembedded in the surface of the release layer;

applying a layer of elastomeric precursor material onto the first major surface of the release layer to overlie the first and the second regions of the metal wire and enter areas between the metal wire strands; converting the layer of the elastomeric precursor material into a layer of elastomeric material; and separating the layer of elastomeric material from the release layer such that the second portion of the surface area of the metal wire remains embedded in the layer of elastomeric material, and the first portion of the surface area of the metal wire is exposed above a major surface of the layer of elastomeric material.

Embodiment EEE

The method according to Embodiment DDD, wherein the structured release layer comprises embossed passivation structures.

Embodiment FFF

The method according to Embodiment EEE, wherein the structured release layer comprises printed passivation structures.

Embodiment GGG

A method of making a stretchable conductor, comprising: contacting a randomly winding braided metal wire with embossed or die cut surface structures protruding away from a surface of a structured release layer, wherein the braided metal wire comprises a plurality of metal wire strands, wherein the surface structures comprise ribs, and wherein the metal wire extends on the surface of the release layer in a direction normal to the direction of the ribs; embedding a first portion of the surface area of the metal wire in the surface of the ribs of the release layer such that a second portion of the surface area of the wire remains unembedded in the surface of the ribs of the release layer, wherein the second portion of the surface area of the metal wire comprises about 1% to about 80% of the total surface area of the metal wire, and applying a layer of elastomeric precursor material onto the first major surface of the release layer; converting the layer of the elastomeric precursor material into a layer of elastomeric material; and separating the layer of elastomeric material from the release layer such that the second portion of the surface area of the metal wire remains embedded in the layer of elastomeric material, and the first portion of the surface area of the metal wire is exposed above a major surface of the layer of elastomeric material.

Embodiment HHH

A method of making a stretchable conductor, comprising: contacting a winding elongate wire with a surface of a release layer; embedding a first portion of the surface area of the wire in the surface of the release layer such that a second portion of the surface area of the wire remains unembedded in the surface of the release layer, wherein the second portion of the surface area of the wire comprises about 1% to about 80% of the total surface area of the wire; applying a layer of a liquid elastomeric precursor material onto the surface of the release layer to overlie the second portion of the surface area of the wire, such that a third portion of the surface area of the wire remains uncovered by the liquid elastomeric precursor; converting the layer of the liquid elastomeric precursor material into a layer of elastomeric material; and separating the layer of elastomeric material from the release layer such that the wire separates from the release layer, the second portion of the surface area of the wire remains embedded in the layer of elastomeric material, and the third portion of the surface area of the wire is not embedded in the layer of elastomeric material. This embodiment is exemplified by the method depicted in FIG. 11.

Other features, objects, and advantages of the invention will be apparent from the drawings the Detailed Description, the Examples, and the claims.

BRIEF DESCRIPTION OF DRAWINGS

The disclosure may be more completely understood in consideration of the following detailed description of various embodiments of the disclosure in connection with the accompanying figures, in which:

FIG. 1A is schematic overhead view of an embodiment of a stretchable conductor construction according to the present disclosure.

FIG. 2A is a schematic cross-sectional view of an embodiment of a stretchable conductor construction according to the present disclosure.

FIG. 7 is an optical micrograph of the braided wire of Example 1.

FIG. 8 is an optical micrograph of the braided wire of Example 1 embedded in an elastomeric substrate material.

FIGS. 9A-9B are optical micrographs of the wire embedded in the elastomeric substrate of Example 2.

Like symbols in the drawings indicate like elements.

Figure 1B:
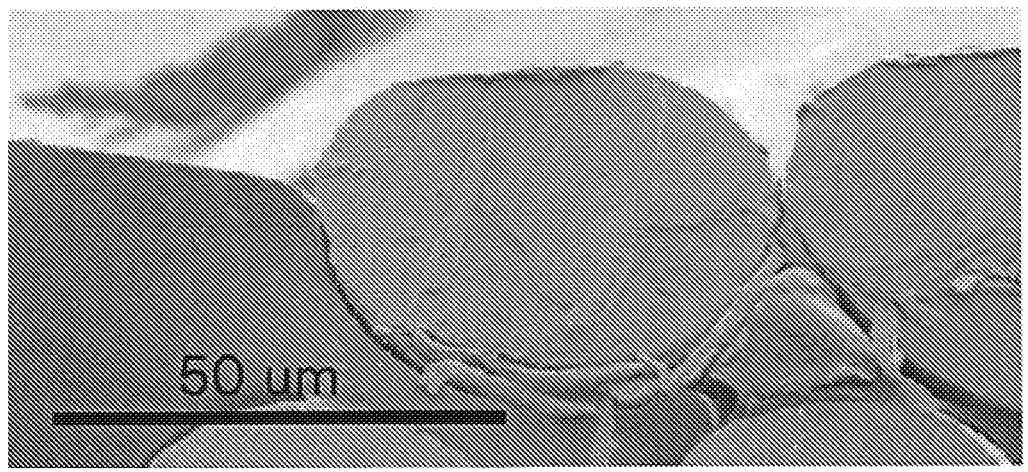
FIG. 1B is a photograph of a cross-section of a drawn wire strand of a twisted wire partially embedded in an elastomeric material.

While the above-identified drawings, which may not be drawn to scale, set forth various embodiments of the present disclosure, other embodiments are also contemplated, as noted in the following Detailed Description.

DETAILED DESCRIPTION

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Turning now to the drawings, FIG. 1 illustrates a portion of a stretchable conductor construction 10 including a substrate 12 of an elastomeric material and at least one elongate electrically conductive wire 14 having regions thereof partially embedded in the substrate 12. The stretchable conductor construction 10 includes at least one region 20 in which: (1) a first portion of the surface area of the wire is embedded in a first major surface 13A of the substrate sufficient to bond the wire 14 to the substrate 12, and (2) a second portion of the surface area of the wire is exposed sufficient that an area of the first major surface 13A of the construction 10 remains electrically conductive in the region 20.

The stretchable conductor construction 10 may optionally include a first contact 16 electrically connected to a first end 15 of the wire 14, and an optional second contact 18 electrically connected to a second end 17 of the wire 14.

In some embodiments, the stretchable conductor construction 10 may be stretched along a direction A generally aligned with a longitudinal direction of the wire 14 without causing the wire 14 to break or de-bond from the first major surface 13A of the substrate 12 in the region 20. In some embodiments, the stretchable conductor construction 10 may also be stretched along a direction B generally normal to the longitudinal direction of the wire 14 without causing the wire 14 to break or debond from the first major surface 13A of the substrate 12. The stretching force applied along the directions A and B may be continuous, or may be applied in stretching cycles where the substrate 12 is repeatedly stretched and relaxed.

The elastomeric material selected for substrate 12 may vary widely depending on the intended application, but generally includes any natural or polymeric material that can form a bond with the wire 14 embedded therein. The substrate 12 may be cast, or may be a woven material, and in some embodiments, has a thickness of about 0.02 mm to about 2.0 mm, or about 0.05 mm to about 0.50 mm.

In some embodiments, the substrate 12 may be made of an elastomeric material, which in this application means a natural or synthetic material with high elongation and recovery, as well as resistance to breaking or cracking. In various embodiments, the elastomeric materials used for the substrate 12 have a Young's modulus less than about 100 Mpa, less than about 50 Mpa, less than about 10 Mpa, less than about 1 Mpa, or even less than 0.5 MPa, measured at room temperature of about 20-25° C. In some embodiments, the elastomeric material for the substrate 12 has a tensile elongation at break of at least about 200%, at least about 100%, or at least about 50% at room temperature.

In various embodiments, the elastomeric materials for the substrate 12 include thermoset elastomers and thermoplastic elastomers. Suitable examples of elastomeric materials include, but are not limited to, natural rubber, polyurethanes, polyureas, polyurethane ureas, polyesters, polycarbonate, polyolefins, acrylic and methacrylic acid ester polymers and copolymers, polyvinyl chloride polymers and copolymers, polyvinyl acetate polymers and copolymers, polyamide polymers and copolymers, fluorine containing polymers and copolymers silicones, silicone containing copolymers, epoxies, thermoplastic elastomers, such as neoprene, acrylonitrile butadiene copolymers, and mixtures and combinations thereof. Combinations can include any combinations of materials, such as interpenetrating networks, dual cure systems, and the like.

In some embodiments, the substrate 12 can optionally include nanoparticles, fibers, and other reinforcing or conductive materials.

In some embodiments, the substrate 12 is made of an elastomeric material that is thermoformable or stretchable. Once formed, a substrate 12 made of suitable thermoformable or stretchable materials should retain its formed dimensions. In some embodiments, a substrate 12 can have elasticity at the forming temperature, but this elasticity can exert a recovery force after forming. To limit or prevent this excessive elastic recovery, the elastic layer can be laminated with another less elastic material such as, for example, polyethylene terephthalate (PET) or polycarbonate (PC).

To be formable, an elastomeric material can be selected for the substrate 12 that can bear the elongation that occurs during forming or stretching without failing, cracking, or generating other defects. In some embodiments, this can be achieved by selecting elastomeric materials that have a temperature at or near which they undergo melt flow and forming. In some embodiments, for example, crosslinked materials that do not flow can be used, but can be more likely to crack during the elongation. To avoid this cracking, the crosslink density should be kept low, as can be indicated by a low storage modulus in the rubbery plateau region. The expected degree of crosslinking can also be approximated as the inverse of the average molecular weight per crosslink, which can be calculated based on the components of a material. In addition, in some embodiments, forming can be conducted at relatively low temperatures, since as temperatures increase above the glass transition temperature of crosslinked materials, their capacity for elongation can begin to decrease.

In one embodiment, the elastomeric material selected for the substrate 12 is a curable composition that includes an epoxy resin component including an epoxy resin having at least two epoxide groups per molecule; a thiol component including a polythiol compound having at least two primary thiol groups; a nitrogen-containing catalyst for the epoxy resin; a silane-functionalized adhesion promoter; and optionally a cure inhibitor. In various embodiments, the cure inhibitor can be a Lewis acid or a weak Bronsted acid.

The curable epoxy/thiol resin composition can be a one-part or a two-part composition. In certain embodiments, a curable "one-part" epoxy/thiol resin composition includes all components, including the thiol curing agent, the nitrogen-containing catalyst, the silane-functionalized adhesion promoter, the cure inhibitor, and any optional additives (e.g., fillers, toughening agents, diluents, and other adhesion promoters) are admixed with the epoxy resin. The cure inhibitor can be a Lewis acid or a weak Bronsted acid. During formulation of a one-part composition, the cure inhibitor is added to the other components of the composition prior to the addition of the nitrogen-containing catalyst.

Additionally, the curable one-part epoxy/thiol resin compositions possess good low-temperature curability. In certain embodiments, the curable one-part epoxy/thiol resin compositions are curable at a temperature of at least 50° C. In certain embodiments, the curable one-part epoxy/thiol resin compositions are curable at a temperature of up to 80° C. In certain embodiments, the curable one-part epoxy/thiol compositions are curable at a temperature of about 60-65° C.

In certain embodiments, selection of the epoxy resin component and the thiol component can provide a cured stretchable material. At least one of such components is stretchable, which means that the epoxy resin component and/or the thiol component (preferably, both the epoxy resin component and the thiol component) are selected to provide a cured polymeric material that has a tensile elongation of at least about 200%, at least about 100%, or at least about 50% at room temperature.

In some embodiments, suitable epoxy resin compositions for the substrate 12 have a Young's Modulus of less than about 5 MPa, or less than about 1 MPa, or less than about 0.9 MPa, or even less than about 0.5 MPa.

In some embodiments, suitable epoxy resins for the substrate 12 are derived from bisphenol A (i.e., bisphenol A is 4,4'-dihydroxydiphenylmethane). Examples include, but are not limited to, those available under the tradename EPON (e.g., EPON 1510, EPON 1310, EPON 828, EPON 872, EPON 1001, EPON 1004, and EPON 2004) from Momentive Specialty Chemicals, Inc. (Columbus, Ohio), those available under the tradename DER (e.g., DER 331, DER 332, DER 336, and DER 439) from Olin Epoxy Co. (St. Louis, Mo.), and those available under the tradename EPICLON (e.g., EPICLON 850) from Dainippon Ink and Chemicals, Inc. (Parsippany, N.J.). Other commercially available diglycidyl ether epoxy resins are derived from bisphenol F (i.e., bisphenol F is 2,2'-dihydroxydiphenylmethane). Examples include, but are not limited to, those available under the tradename DER (e.g., DER 334) from Olin Epoxy Co. (St. Louis, Mo.), those available under the tradename EPICLON (e.g., EPICLON 830) from Dainippon Ink and Chemicals, Inc. (Parsippany, N.J.), and those available under the tradename ARALDITE (e.g., ARALDITE 281) from Huntsman Corporation (The Woodlands, Tex.).

Other suitable epoxy resins are diglycidyl ethers of a poly(alkylene oxide) diol. Examples include, but are not limited to, diglycidyl ethers of poly(ethylene oxide) diol, diglycidyl ethers of poly(propylene oxide) diol, and diglycidyl ethers of poly(tetramethylene oxide) diol. Epoxy resins of this type are commercially available from Polysciences, Inc. (Warrington, Pa.).

Still other suitable epoxy resins are diglycidyl ethers of an alkane diol, such as those commercially available under the tradename EPONEX (e.g., EPONEX 1510) from Hexion Specialty Chemicals, Inc. (Columbus, Ohio) and under the tradename EPALLOY (e.g., EPALLOY 5001) from CVC Thermoset Specialties (Moorestown, N.J.).

For some applications, the epoxy resins chosen for use in the curable coating compositions are novolac epoxy resins, which are glycidyl ethers of phenolic novolac resins. The use of novolac epoxy resins can be particularly desirable in applications where corrosion resistance, water resistance, chemical resistance, or a combination thereof is desired. One such novolac epoxy resin is poly[(phenyl glycidyl ether)-co-formaldehyde]. Other suitable novolac resins are commercially available under the tradename ARALDITE (e.g., ARALDITE GY289, ARALDITE EPN 1183, ARALDITE EP 1179, ARALDITE EPN 1139, and ARALDITE EPN 1138) from Huntsman Corporation (The Woodlands, Tex.), under the tradename EPALLOY (e.g., EPALLOY 8230) from CVC Thermoset Specialties (Moorestown, N.J.), and under the tradename DEN (e.g., DEN 424 and DEN 431) from Olin Epoxy Co. (St. Louis, Mo.).

Yet other epoxy resins include silicone resins with at least two glycidyl groups and flame retardant epoxy resins with at least two glycidyl groups (e.g., a brominated bisphenol-type epoxy resin having at least two glycidyl groups such as that commercially available from Dow Chemical Co. (Midland, Mich.) under the tradename DER 580).

In some embodiments, the curable epoxy/thiol resin compositions typically include at least 20 weight percent (wt %), at least 25 wt %, at least 30 wt %, at least 35 wt %, at least 40 wt %, or at least 45 wt %, of the epoxy resin component, based on a total weight of the curable epoxy/thiol resin composition. If lower levels are used, the cured composition may not contain enough polymeric material (e.g., epoxy resin) to provide desired coating characteristics. In some embodiments, the curable epoxy/thiol resin compositions include up to 80 wt %, up to 75 wt %, or up to 70 wt %, of the epoxy resin component, based on a total weight of the curable epoxy/thiol resin composition.

A thiol is an organosulfur compound that contains a carbon-bonded sulfhydryl or mercapto (—C—SH) group. Suitable polythiols are selected from a wide variety of compounds that have two or more thiol groups per molecule, and that function as curatives for epoxy resins. Examples of suitable polythiols include trimethylolpropane tris(beta-mercaptopropionate), trimethylolpropane tris(thioglycolate), pentaerythritol tetrakis(thioglycolate), pentaerythritol tetrakis(beta-mercaptopropionate), dipentaerythritol poly(beta-mercaptopropionate), ethylene glycol bis(beta-mercaptopropionate), a (C1-C12)alkyl polythiol (e.g., butane-1,4-dithiol and hexane-1,6-dithiol), a (C6-C12) aromatic polythiol (e.g., p-xylenedithiol and 1,3,5-tris (mercaptomethyl) benzene). Combinations of polythiols can be used if desired.

In some embodiments, the curable epoxy/thiol resin compositions typically include at least 25 wt %, at least 30 wt %, or at least 35 wt %, of the thiol component, based on a total weight of the curable epoxy/thiol resin composition. In some embodiments, the curable epoxy/thiol resin compositions include up to 70 wt %, up to 65 wt %, up to 60 wt %, up to 55 wt %, up to 50 wt %, up to 45 wt %, or up to 40 wt %, of the thiol component, based on a total weight of the curable epoxy/thiol resin composition. Various combinations of two or more polythiols can be used if desired.

In some embodiments, the ratio of the epoxy resin component to the thiol component in the curable epoxy/thiol resin compositions of the present disclosure is from 0.5:1 to 1.5:1, or 0.75:1 to 1.3:1 (epoxy:thiol equivalents).

Examples of adhesion silane-functionalized adhesion promoters include, for example, 3-glycidoxypropyltriethoxysilane 5,6-epoxyhexyltriethoxysilane, 2-(3,4-epoxy cyclohexyl)ethyltriethoxysilane, mercaptopropyltriethoxysilane, s-(octanoyl)mercaptopropyltriethoxysilane, hydroxy(polyethyleneoxy)propyl]triethoxysilane, and mixtures and combinations thereof.

In some embodiments, the curable epoxy/thiol resin compositions typically include at least 0.1 part, or at least 0.5 part, silane-functionalized adhesion promoter, based on 100 parts of the combined weights of the epoxy resin and thiol components. In some embodiments, the curable epoxy/thiol resin compositions include up to 5 parts, or up to 2 parts, based on 100 parts of the combined weights of the epoxy resin and thiol components. Various combinations of two or more silane-functionalized adhesion promoters can be used if desired.

As used herein, the term "nitrogen-containing catalyst" refers to any nitrogen-containing compound that catalyzes the curing of the epoxy resin. The term does not imply or suggest a certain mechanism or reaction for curing. The nitrogen-containing catalyst can directly react with the oxirane ring of the epoxy resin, can catalyze or accelerate the reaction of the polythiol compound with the epoxy resin, or can catalyze or accelerate the self-polymerization of the epoxy resin.

In certain embodiments, the nitrogen-containing catalysts are amine-containing catalysts. Exemplary nitrogen-containing catalysts for use herein include a reaction product of phthalic anhydride and an aliphatic polyamine, more particularly a reaction product of approximately equimolar proportions of phthalic acid and diethylamine triamine, as described in British Patent 1,121,196 (Ciba Geigy AG). A catalyst of this type is available commercially from Ciba Geigy AG under the tradename CIBA HT 9506.

Yet another type of nitrogen-containing catalyst is a reaction product of: (i) a polyfunctional epoxy compound; (ii) an imidazole compound, such as 2-ethyl-4-methylimidazole; and (iii) phthalic anhydride. The polyfunctional epoxy compound may be a compound having two or more epoxy groups in the molecule as described in U.S. Pat. No. 4,546,155 (Hirose et al.). A catalyst of this type is commercially available from Ajinomoto Co. Inc. (Tokyo, Japan) under the tradename AJICURE PN-23, which is believed to be an adduct of EPON 828 (bisphenol type epoxy resin epoxy equivalent 184-194, commercially available from Hexion Specialty Chemicals, Inc. (Columbus, Ohio)), 2-ethyl-4-methylimidazole, and phthalic anhydride.

Other suitable nitrogen-containing catalysts include the reaction product of a compound having one or more isocyanate groups in its molecule with a compound having at least one primary or secondary amino group in its molecule. Additional nitrogen-containing catalysts include 2-heptadeoylimidazole, 2-phenyl-4,5-dihydroxymethylimidazole, 2-phenyl-4-methyl-5-hydroxymethylimidazole, 2-phenyl-4-benzyl-5-hydroxymethylimidazole, 2,4-diamino-8-2-methylimidazolyl-(1)-ethyl-5-triazine, or a combination thereof, as well as products of triazine with isocyanuric acid, succinohydrazide, adipohydrazide, isophtholohydrazide, o-oxybenzohydrazide, salicylohydrazide, or a combination thereof.

Nitrogen-containing catalysts are commercially available from sources such as Ajinomoto Co. Inc. (Tokyo, Japan) under the tradenames AMICURE MY-24, AMICURE GG-216 and AMICURE ATU CARBAMATE, from Hexion Specialty Chemicals, Inc. (Columbus, Ohio) under the tradename EPIKURE P-101, from T&K Toka (Chikumazawa, Miyoshi-Machi, Iruma-Gun, Saitama, Japan) under the tradenames FXR-1020, FXR-1081, and FXR-1121, from Shikoku (Marugame, Kagawa Prefecture, Japan) under the tradenames CUREDUCT P-2070 and P-2080, from Air Products and Chemicals (Allentown, Pa.) under the tradenames ANCAMINE 2441 and 2442, from AC Catalysts (Linden, N.J.) under the tradenames TECHNICURE LC80 and LC100, and from Asahi Kasei Kogyo, K.K. (Japan) under the tradename NOVACURE HX-372.

Other suitable nitrogen-containing catalysts are those described in U.S. Pat. No. 5,077,376 (Dooley et al.) and U.S. Pat. No. 5,430,112 (Sakata et al.) referred to as "amine adduct latent accelerators." Other exemplary nitrogen-containing catalysts are described, for example, in British Patent 1,121,196 (Ciba Geigy AG), European Patent Application No. 138465A (Ajinomoto Co.), and European Patent Application No. 193068A (Asahi Chemical).

In embodiments of two-part epoxy/thiol resin compositions, a variety of nitrogen-containing compounds, such as amines, can be used as catalysts. In some embodiments, the amine catalyst can be an imidazole, an imidazole-salt, an imidazoline, or a combination thereof. One exemplary curative is tris-2,4,6-(dimethylaminomethyl) phenol, commercially available under the tradename ANCAMINE K54 from Evonik (Essen, Germany). A second, more reactive, exemplary curative is 1,8-diazabicyclo(5.4.0)unde-7-ene (DBU) commercially available from Sigma Aldrich (St. Louis, Mo.).

In some embodiments, the curable epoxy/thiol resin compositions typically include at least 1 part, at least 2 parts, at least 3 parts, at least 4 parts, or at least 5 parts, of a nitrogen-containing catalyst, per 100 parts of the epoxy resin component. In some embodiments, the curable epoxy/thiol resin compositions typically include up to 45 parts, up to 40 parts, up to 35 parts, up to 30 parts, up to 25 parts, or up to 20 parts, of a nitrogen-containing catalyst, per 100 parts of the epoxy resin component. Various combinations of two or more nitrogen-containing catalysts can be used if desired.

In embodiments of one-part epoxy/thiol resin compositions, an inhibitor is often necessary to obtain a reasonable shelf life/workability life at room temperature. The inhibitor typically retards the activity of the nitrogen-containing catalyst so that it does not proceed at an appreciable rate at room temperature. Although a cure inhibitor could be used in a two-part epoxy/thiol resin composition, it is not necessary.

Such cure inhibitors can be Lewis or weak Bronsted acids (i.e., having a pH of 3 or more), or a combination thereof. Such cure inhibitor is soluble in the epoxy/thiol resin composition.

Examples of Lewis acids include borate esters, such as that available under the tradename CUREZOL L-07N from Shikoku (Kagawa, Japan), as well as $CaNO_3$ and $MnNO_3$ available from Sigma Aldrich (Milwaukee, Wis.). Various combinations of Lewis acids can be used if desired.

Examples of weak Bronsted acids include barbituric acid derivatives, 1,3-cyclohexanedione, and 2,2-dimethyl-1,3-dioxane-4,6-dione from Sigma Aldrich (Milwaukee, Wis.). Various combinations of weak Bronsted acids can be used if desired.

A soluble cure inhibitor is used in an epoxy/thiol resin composition in an amount that allows the epoxy/thiol resin composition to remain curable for at least 72 hours at room temperature such that there is no doubling in viscosity. Typically, this is an amount of at least 0.01 wt %, based on the total weight of the curable epoxy/thiol resin composition.

The greater the amount of a soluble cure inhibitor used in an epoxy/thiol resin composition, generally the longer the shelf life of the curable epoxy/thiol resin composition. The greater the amount of a cure inhibitor used in an epoxy/thiol resin composition, generally the longer the time required to cure and/or the higher the temperature required to cure the curable epoxy/thiol resin composition. Thus, depending on the use of the curable composition, there is a balance between shelf life and cure time/temperature. Typically, for a reasonable shelf life, cure time, and cure temperature, the amount of soluble cure inhibitor used is up to 1 wt %, or up to 0.5 wt %.

In addition to the epoxy resin component, the thiol component, the silane adhesion promoter, the nitrogen-containing catalyst, and the optional cure inhibitor, the curable composition can include other various optional additives.

For example, in some embodiments, the curable composition can additionally contain a non-reactive plasticizer to modify rheological properties. Commercially available plasticizers include those available under the tradename BENZOFLEX 131 from Eastman Chemical (Kingsport, Tenn.), JAYFLEX DINA available from ExxonMobil Chemical (Houston, Tex.), and PLASTOMOLL (e.g., diisononyl adipate) from BASF (Florham Park, N.J.).

In some embodiments, the curable composition optimally contains adhesion promoters other than the silane adhesion promoter to enhance the bond to the substrate. The specific type of adhesion promoter may vary depending upon the composition of the surface to which it will be adhered. Adhesion promoters that have been found to be particularly useful for surfaces coated with ionic type lubricants used to facilitate the drawing of metal stock during processing include, for example, dihydric phenolic compounds such as catechol and thiodiphenol.

The curable composition optionally may also contain one or more conventional additives such as fillers (e.g., aluminum powder, carbon black, glass bubbles, talc, clay, calcium carbonate, barium sulfate, titanium dioxide, silica such as fused silica, silicates, glass beads, and mica), pigments, flexibilizers, reactive diluents, non-reactive diluents, fire retardants, antistatic materials, thermally and/or electrically conductive particles, and expanding agents including, for example, chemical blowing agents such as azodicarbonamide or expandable polymeric microspheres containing a hydrocarbon liquid, such as those sold under the tradename EXPANCEL by Expancel Inc. (Duluth, Ga.). Particulate fillers can be in the form of flakes, rods, spheres, and the like. Additives are typically added in amounts to produce the desired effect in the resulting adhesive.

The amount and type of such additives may be selected by one skilled in the art, depending on the intended end use of the composition.

In another aspect, the elastomeric material selected for the substrate 12 includes an aliphatic polyurethane polymer with a plurality of soft segments, and a plurality of hard segments, wherein the soft segments include a polycarbonate polyol. In some embodiments, which are not intended to be limiting, the specific chemical identities and relative amounts of the segments and moieties of the aliphatic polyurethane polymer are selected to impart a glass transition temperature of 10° C. or less in the substrate, a Young's Modulus of less than about 10 MPa, or less than about 7 MPa, and a storage modulus in the substrate that changes less than 15 MPa from about 25° C. to about 175° C.

In some embodiments, the elastomeric material selected for the substrate 12 includes two component (or also referred to herein as "2K") urethanes coated from solvent, 100% solids two component urethanes and two layer urethanes. The urethane elastomeric materials can be formed, for example, out of solution, aqueous dispersion, or 100% solids coating such as via hot melt or extrusion. The urethane elastomeric layer may be transparent, translucent, or opaque, and may be colored or colorless. The elastomeric substrate layer may, for example, be clear and colorless or pigmented with opaque, transparent, or translucent dyes and/or pigments. In some embodiments, inclusion of specialty pigments, such as for example metallic flake pigments, can be useful.

In some embodiments, the elastomeric materials selected for the substrate 12 include silicones such as those available from Dow Corning, Midland, Mich., under the trade designation Sylgard. In various embodiments, suitable silicone materials have a Young's Modulus of less than about 10 MPa, or less than about 8 MPa, or less than about 7 MPa at room temperature.

In some embodiments, the elastomeric materials selected for the substrate 12 are not crosslinked or are very lightly crosslinked. Lightly crosslinked materials can be useful over highly crosslinked materials when it desirable to produce articles having less elastic recovery energy after being deformed in the forming process. Also, lightly crosslinked materials tend to accommodate higher degrees of elongation before failing compared to highly crosslinked materials. In some embodiments, non-crosslinked materials are preferred to give very high degrees of elongation. In some embodiments, lightly crosslinked materials are useful over non-crosslinked materials to give better resistance to water and chemicals, as well as resistance to creep and other dimensional instability over time.

Referring again to FIG. 1A, in some embodiments, the substrate 12 can include one or more additional support layers 21 to, for example, provide reinforcement or otherwise modify the properties of the substrate 12. For example, in some embodiments, the support layer 21 can be a thermoplastic material with a relatively low forming temperature. Suitable examples for the thermoplastic layer 21 include, but are not limited to PC and PC blends, thermoplastic polyurethane (TPU), and non-crystalline PET such as amorphous PET or PETG. In some embodiments, the support layer 21 can include backing materials such as, for example, silicones, woven or non-woven materials, or fabrics.

In some embodiments, the support layer 21, or the substrate 12, may include an adhesive layer 23 for attaching the substrate 12 to another component or layer. The adhesive layer 23 can optionally include a protective release liner 25.

In some embodiments, as shown schematically in FIG. 1A, all or a portion of the surface 13A of the substrate 12 may be overlain with an optional overcoated or laminated protective layer 27. The protective layer 27 may optionally include access regions 29 to expose selected portions of the wire 14 to provide electrical contact with, for example, human or animal skin, other conductors, switches, electronic devices and the like.

In some embodiments, portions of the wire 14 are exposed, and the exposed portions of the wire 14 may be soldered or otherwise electrically connected to other wires or electronic devices 16, 18. Electronic components are known to be difficult to directly solder to ink-based conductive traces, and the stretchable conductive construction 10 can provide any number of sites to which electronic components can be directly soldered, or can provide attachment sites for conductive adhesives.

The elongate electrically conductive wire 14 may also vary widely depending on the intended application for the construction 10, and in this application refers to single, flexible strands or rods of a metal. In various embodiments, the wire 14 may be made of metals, metal alloys, metal oxides, conductive polymers, carbon, and combinations thereof. In various embodiments, the metal or metal alloy may include, but is not limited to, aluminum, stainless steel, or a transition metal, and any applicable metal alloy, including alloys with carbon. Non-limiting examples of transition metals include copper, silver, gold, platinum, zinc, nickel, titanium, chromium, or palladium, brass, bronze, or any combination thereof. In other non-limiting examples, suitable conductive materials may include a semiconductor-based conductive material, including a silicon-based conductive material, indium tin oxide or other transparent conductive oxide, or Group III-IV conductor (including GaAs). The semiconductor-based conductive material may optionally be doped. In some embodiments, the wire is a non-metallic material such as, for example, carbon, carbon nano-tubes, graphene, and conductive polymers (for example, PEDOT).

In any of the example constructions described herein, the wires 14 have a thickness of about 0.1 μm, about 0.3 μm, about 0.5 μm, about 0.8 μm, about 1 μm, about 1.5 μm, about 2 μm, about 5 μm, about 9 μm, about 12 μm, about 25 μm, about 50 μm, about 75 μm, about 100 μm, or greater.

In various embodiments, the electrical wire 14 may be a solid, drawn wire as shown in cross-section in FIG. 1B, a twisted wire made from a plurality of conductive strands twisted together (FIG. 1C), a braided wire that includes twisted strands wrapped about a central core, or other special kinds of wires such as, for example, resistance wires and coaxial cables.

The term "drawn wire" in this application refers to a metal drawn out into a thin, solid, flexible thread or rod. Wire drawing is a metalworking process used to reduce the cross-section of a wire by pulling the wire through a single, or series of, drawing die(s). The drawing is usually performed at room temperature, thus classified as a cold working process, but it may be performed at elevated temperatures for large wires to reduce forces. The drawn wire may have any cross-sectional shape, but cylindrical wires with a generally circular or oval cross-sectional shape have been found to work well, as have drawn wires with square or rectangular cross sections.

Excepting metallurgical flaws normally associated with casting defects and mechanical damage caused by handling, the characteristics of the surface of the wire are at least in part a function of the working surfaces, rolls and dies used in processing the wire. For example, the surface roughness of these working surfaces can be measured with a profilometer. Because of the small width and different shapes inherent to wire, the most reliable measurements are performed at the center of the wire and then profiled down a specified length of the wire. Specifications for surface roughness are derived from the measurement scale used. In various embodiments, which are not intended to be limiting, the range of surface roughness for cold drawn wires is about 0.2 microns to 12 microns, or from about 0.8 microns to 3.2 microns.

Solid metallic materials are crystalline in structure. The element atoms, bound together to make the bulk material, are arranged in a regular, repeating three-dimensional array. Copper alloys, as are most metals, are polycrystalline, and are composed of aggregations of crystals joined at boundaries. Aggregations of unit crystals are termed grains and the boundaries between them are the grain boundaries.

Grain size is controlled by the annealing process. The metal is heated to a temperature above its recrystallization temperature. At this temperature, the atoms in the cold work distorted crystalline structure use the cold work energy stored in the crystal lattice plus energy absorbed from heating to nucleate into new orderly crystalline patterns. These new grains are then capable of absorbing new amounts of cold work. The size of the new grain depends on the annealing temperature, the time at temperature, the preceding amount of cold work and the grain size from the preceding anneal. Grain size measurement is predicated on the assumption that in fully annealed wrought metal the grain morphology is equiaxed; the apparent size of each grain is essentially the same for any axis of measurement. A metal structure is an aggregate of grains varying in size and shape, and the grain size is an estimate of the average size and is reported in millimeters (see ASTM E112).

The grain size of a metal or single-phase alloy is an estimate of the average grain diameter, usually expressed in millimeters. As the average grain size decreases, the metal becomes stronger (more resistant to plastic flow) and as the grain size increases, the opposite effect on strength occurs. In general, for a given alloy and thickness, ductility increases with grain size and strength decreases. This occurs because the smaller the grains, the shorter the distance dislocations can move. Therefore, in some embodiments, it is desirable to use metal of the smallest average grain size which can be economically fabricated into the desired wire structure.

In some embodiments, which are provided as non-limiting examples, the range of grain sizes for copper are from about 0.005 mm to about 0.060 mm, or from about 0.005 mm to about 0.020 mm.

Twisted wires include a plurality of thin, elongate conductive metal wires wound about one another, and may be formed into a tubular shape or a flat shape like a grounding strap. Braided wires include a plurality of twisted metal wires wrapped or twisted about a drawn metal wire core having a larger diameter.

Figure 1C:
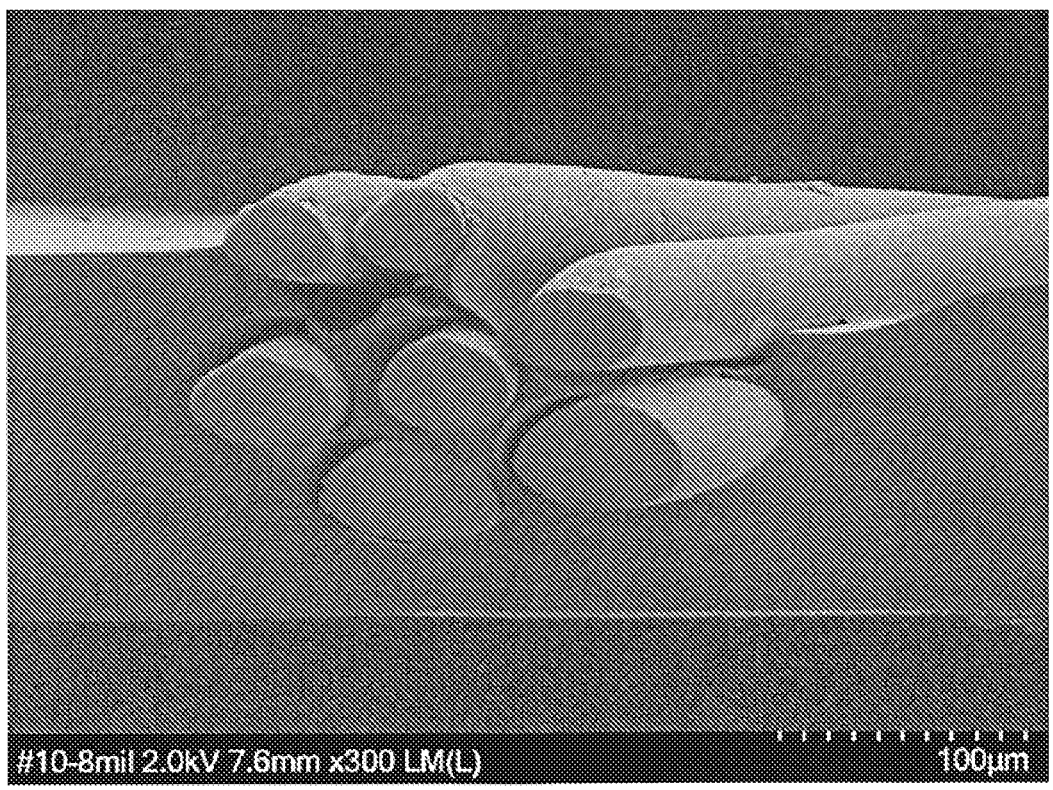
FIG. 1C is a photograph of a cross section of a twisted wire partially embedded in an elastomeric material.

In some embodiments, if the wire 14 is a twisted or braided metal wire, the elastomeric material resides in the interstices between the metallic strands of the wire, and encapsulates and bonds to individual metallic strands of the twisted or braided metal wire. In some embodiments, these multiple sites of encapsulation and bonding can enhance the adhesion of the twisted or braided metal wire 14 to the elastomeric substrate 12, and reduce or eliminate de-bonding and de-embedment of the wire 14 from the substrate 12 when the substrate 12 is stretched or otherwise deformed. An example cross-sectional view of a twisted wire with interstitial elastomeric material is shown in FIGS. 1B-1C.

In some embodiments, all or a portion of the conductive strands in the drawn, twisted or braided wires 14 may include shielding or other insulative coverings, although wires exposed on the first major surface 13A can provide better conductivity in the region 20 of the stretchable conductor construction 10. In some embodiments, the shielding or insulative covering can optionally include openings to allow electrical interconnection to other electronic devices.

In some embodiments, the substrate 12 may optionally include non-conductive reinforcing materials 22 along the electrical wires 14, or otherwise placed in or on the substrate 12 to provide mechanical stability and resist deformation or de-bonding of the electrical wires when force is applied along the directions A or B to stretch the construction 10.

The wires 14 may have a wide variety of patterns in the conductive region 20 on the first major surface 13A of the substrate 12, and typically have a random or non-random systematic winding pattern when the substrate 12 is viewed from above. The pattern of the wire 14 includes at least one arcuate region 24 between the first end 15 and the second end 17 thereof, and some embodiments includes a plurality of arcuate regions 24. In this application, the term arcuate refers to a wire 14 having a total length greater than the length of a straight line between the ends 15, 17 thereof. The arcuate wire 14 can elongate when force is applied to stretch the construction 10 along the direction A or B, and can prevent damage to the wires 14 or de-bonding of the wires 14 from the first major surface 13A of the substrate 12.

Figure 1D:
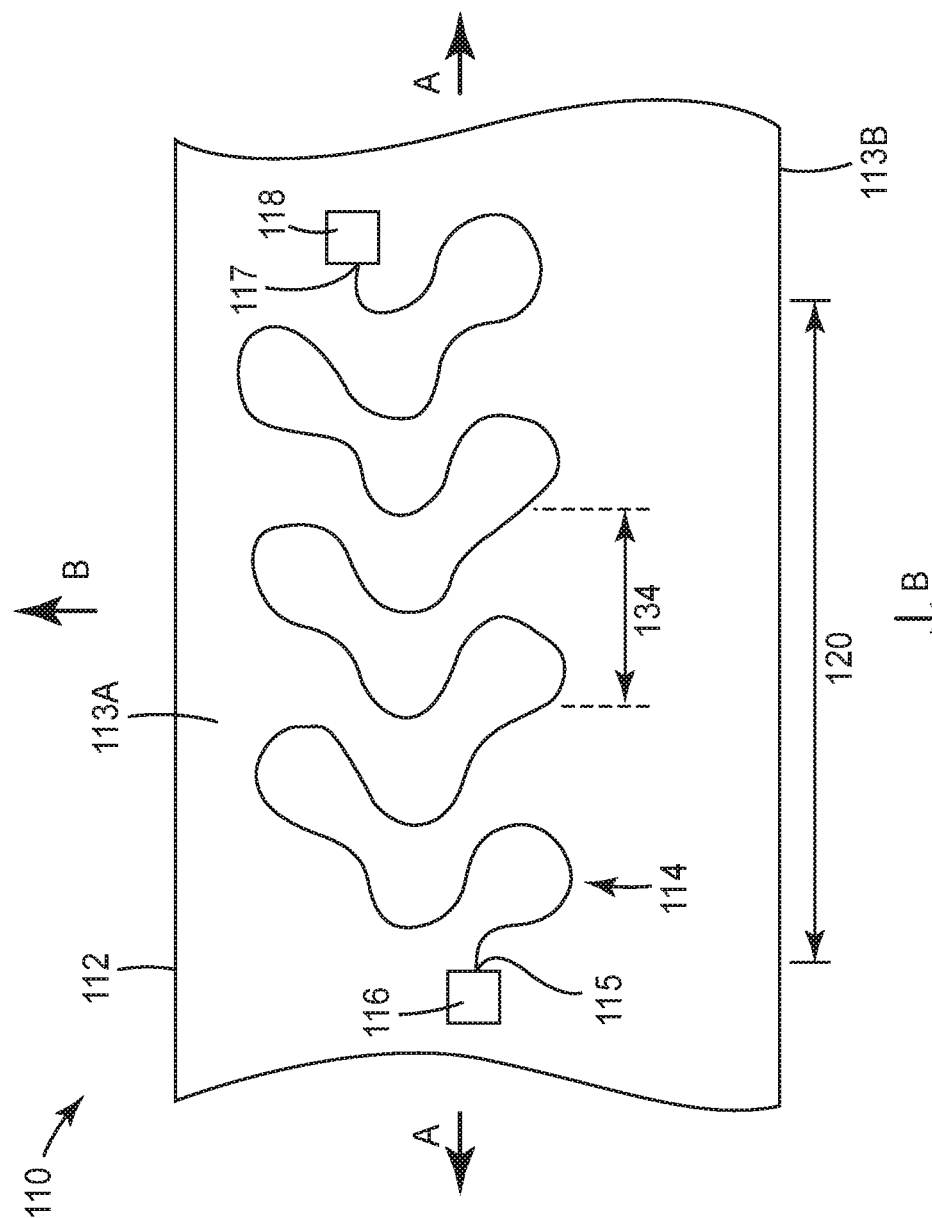
FIG. 1D is schematic overhead view of an embodiment of a stretchable conductor construction according to the present disclosure.

As shown in an embodiment of a stretchable conductive construction 110 in FIG. 1D, a wide variety of patterns in the wires 114 may be used to further enhance the bond between the conductors 114 and the substrate 112. In FIG. 1D, the wires 114 may have a serpentine pattern in the conductive region 120 between the first end 115 and the second end 117 thereof, which means that the wires 114 wind in a snake-like configuration between the ends 115, 117. In the embodiment of FIG. 1B, the serpentine pattern includes nested loops 134, which allow stretching of the wire 114 in multiple directions A and B without deformation or de-bonding or de-embedding from the substrate 112. In other embodiments, a fractal serpentine pattern, a sine wave or square wave pattern, or any randomly winding pattern may be used in with the wire 114 in the conductive region 120 to allow the wire to be stretched in multiple directions A and B without deformation or de-bonding.

In various embodiments, the pattern in the wires 114 may be applied by any suitable technique including, but not limited to, forming or bending the wire around a mandrel, applying a force to the wire and allowing the wire to relax prior to or after the wire is applied on the substrate, by heating or cooling the wire, or by using a memory metal wire with a predetermined shape or pattern.

Referring to FIG. 2A, a portion of a stretchable conductive construction 210 is shown that includes an electrically conductive wire 214 partially embedded in a first major surface 213A of a substrate 212. The wire 214 includes a first surface area portion 214A that is embedded in and lies below the first major surface 213 of the substrate 212. The wire further includes a second surface area portion 214B that lies exposed above the first major surface 213 of the substrate 212. In some embodiments, the relationship between the first and second surface area portions 214A, 214B may be selected to prevent de-bonding between the wire 214 and the substrate 212, or to prevent breakage of the wire 214 when stretching force or strain is applied to the substrate 212. The relationship between the first and the second surface area portions 214A, 214B may be controlled based on factors including, for example, the cross-sectional shape and diameter d of the wire 214, as well as the level of adhesion between the wire and the material selected for the elastomeric substrate 212. In some embodiments, the relationship between the first and second surface area portions 214A, 214B may be selected to provide a desired level of conductivity for a selected region of the substrate 212. In most cases, both de-bonding, conductivity on the surface 213, and resistance to stretching and strain are considered in selecting the relationship between the first and second surface area portions 214A, 214B. For example, in various embodiments, the relationship between the surface area portions 214A, 214B may also be controlled such that the second portion of the surface area of the wire 214B exposed above the first major surface 213 makes up about 1% to about 99% of the total surface area of the wire 214, or about 5% to about 70%, or about 10% to about 50%, or about 25% to about 50%.

Figure 2B:
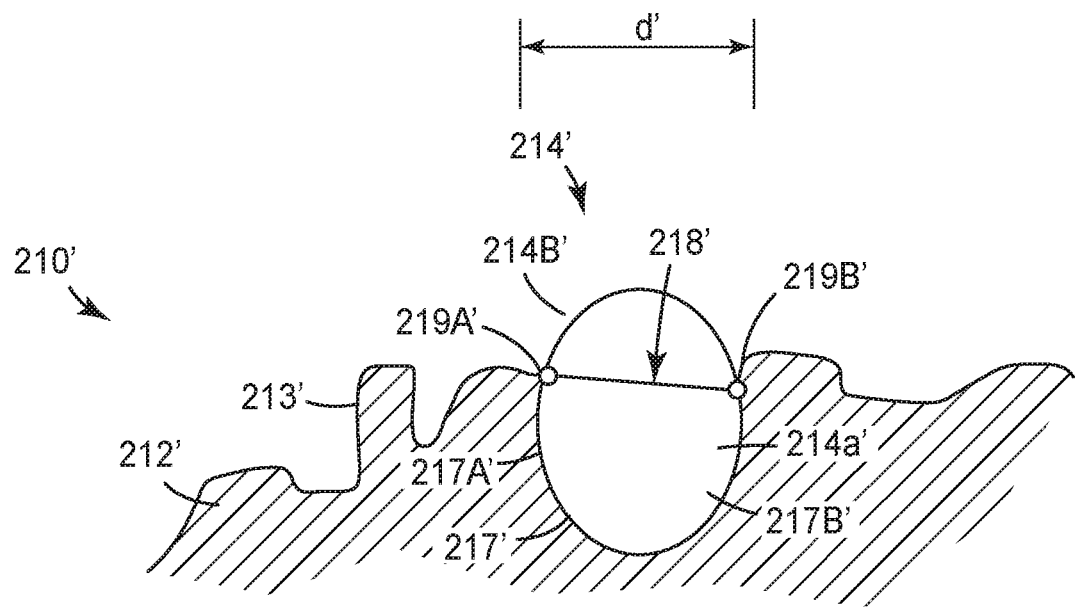
FIG. 2B is a schematic cross-sectional view of another embodiment of a stretchable conductor construction according to the present disclosure.

In another embodiment illustrated in FIG. 2B, a portion of a stretchable conductive construction 210' is shown that includes a wire 214' partially embedded in a region 217' in a major surface 213' of a substrate 212'. The wire 214' includes a first surface area portion 214A' that is embedded in the region 217' and lies below a surface 218' defined by a line that extends from a first conductor/substrate contact point 219A' on a first side 217A' of the region 217' to a second conductor/substrate contact point 219B' on a second side 217B' of the region 217'. The wire 214' further includes a second surface area portion 214B' that lies exposed above the surface 218'. In some embodiments, the relationship between the first and second surface area portions 214A', 214B' may be selected to provide sufficient conductivity on the surface of the substrate 213' and to prevent de-bonding, wire breakage and resistance to substrate stretching and strain as discussed above with reference to FIG. 2A.

Figure 2C:
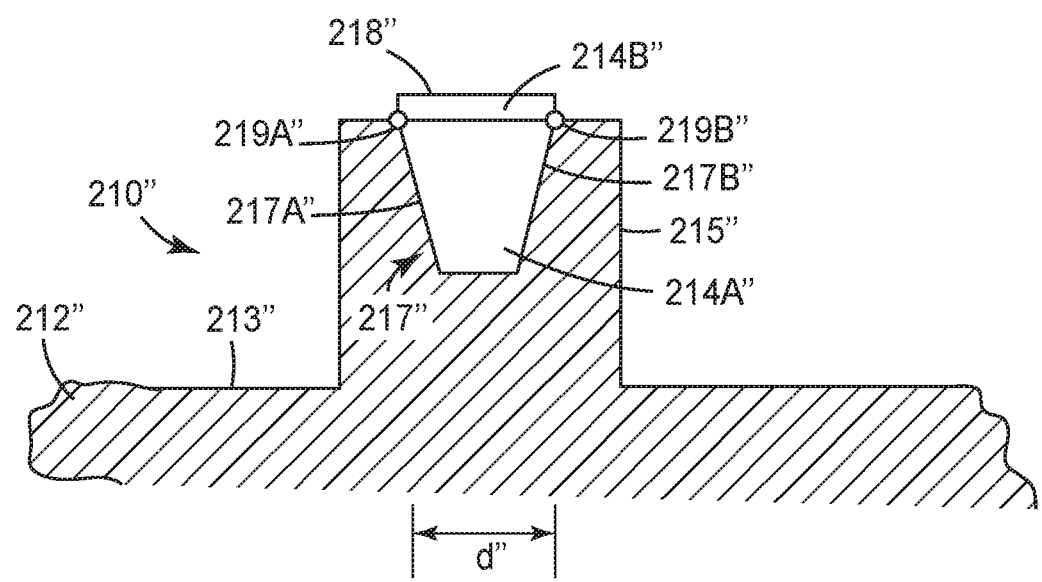
FIG. 2C is a schematic cross-sectional view of another embodiment of a stretchable conductor construction according to the present disclosure.

In another embodiment illustrated in FIG. 2C, a portion of a stretchable conductive construction 210" is shown that includes a wire 214" partially embedded in a region 217" in an elevated surface structure 215" extending above a major surface 213" of a substrate 212". The wire 214" includes a first surface area portion 214A" that is embedded in the region 217" and lies below a surface 218" defined by a line that extends from a first conductor/substrate contact point 219A" on a first side 217A" of the region 217" to a second conductor/substrate contact point 219B" on a second side 217B" of the region 217". The wire 214" further includes a second surface area portion 214B" that lies exposed above the surface 218". In some embodiments, the relationship between the first and second surface area portions 214A", 214B" may be selected to provide sufficient conductivity on the surface of the substrate 213", and to prevent de-bonding, wire breakage and resistance to substrate stretching and strain as discussed above with reference to FIGS. 2A-2B.

As noted above, FIGS. 1A-1B and 2A-2C illustrate only a portion of the wire 14, 114, 214. In various embodiments, other regions of the wire not shown in FIGS. 1A-1B and 2A-2C may be straight or include arcuate regions, may extend above or below the major surfaces of the substrate 12, 112, 212, or include additional structures for electrical interconnection or additional electronic devices such as, for example, a semiconductor device, an electronic device, an optical device, an opto-electronic device, a mechanical device, a microelectromechanical device, a nanoelectromechanical device, a microfluidic device, a sensor, a light-emitting device, or a thermal device. Suitable examples of devices that may be connected to the wire 14 or included with the stretchable construction 10 include, but are not limited to a photodetector, a photodiode array, a display, a light-emitting device, a photovoltaic device, a sensor, a sensor array, a light-emitting diode, a semiconductor laser, an optical imaging system, a transistor, a microprocessor, an integrated circuit, or any combination of thereof.

Figure 3:
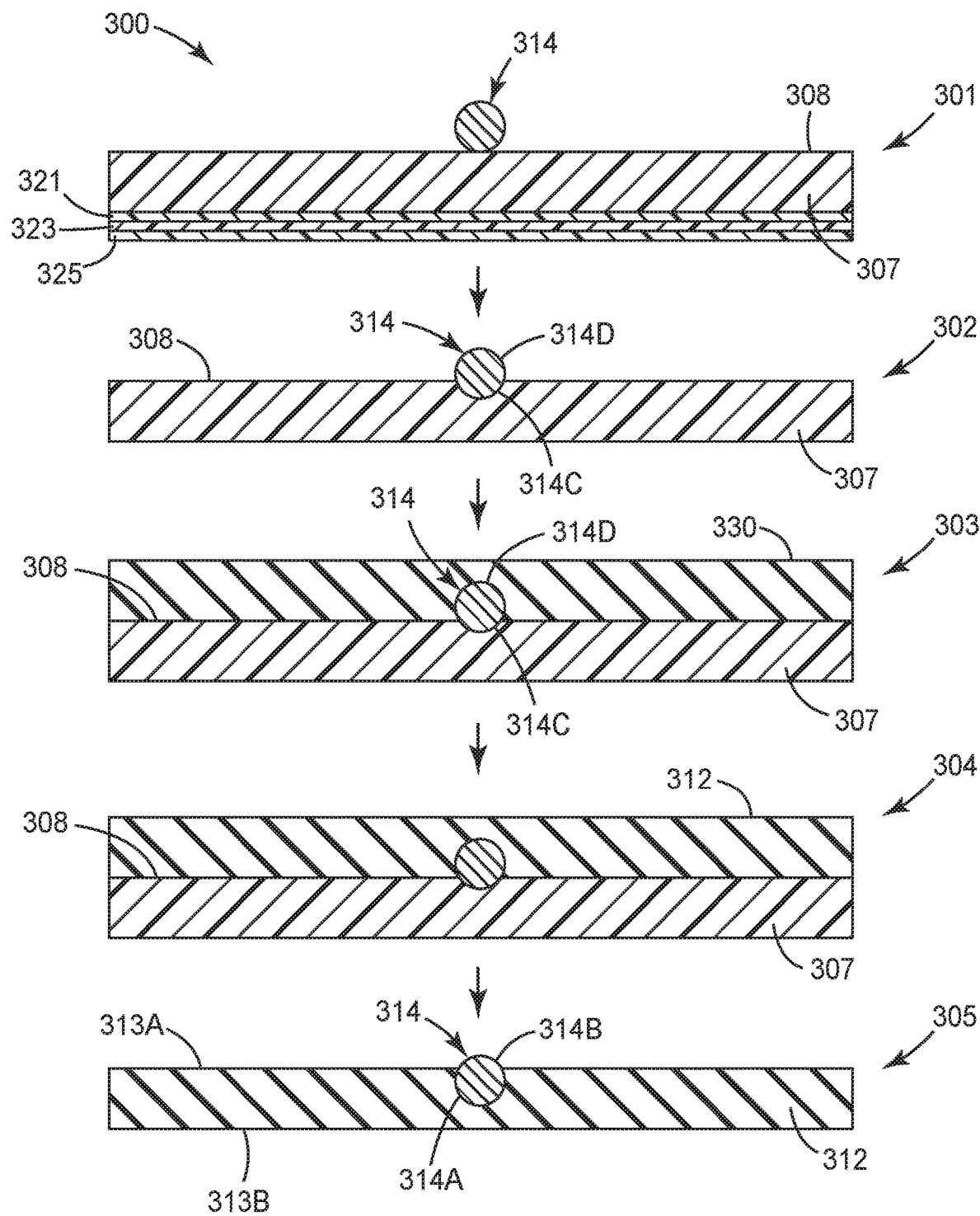
FIG. 3 is a schematic diagram of a process for making a stretchable conductor construction according to the present disclosure.

FIG. 3 illustrates an embodiment of a process 300 for making a stretchable conductive construction according to the present disclosure. In step 301, a randomly winding wire 314 contacts a first major surface 308 of a release layer 307 that temporarily partially embeds at least a portion of the wire 314.

In some embodiments, the randomly winding wire 314 may be pre-formed into a suitable randomly winding pattern before contacting the first major surface 308 of the release layer 307. In some embodiments, the wire 314, the release layer 307, or both, may be stretched and relaxed to cause the wire to assume a randomly winding or serpentine shape. Such a stretching process may be suitable, for example, when the wire is a spring steel solid or braided wire.

The material selected for the release layer 307 may vary widely, and in some embodiments the release layer 307 may be made from thermoplastic polymeric materials that have low adhesion to the wire 314, so that the release layer 307 can be removed to expose the surface of the wire 314. Suitable thermoplastic polymeric materials for the release layer 307 include, but are not limited to, polyolefins such as polyethylene, polypropylene, organic waxes, blends thereof, and the like. In some embodiments, low to medium density (about 0.910 to 0.940 g/cc density) polyethylene is useful for the release layer 307 because it has a inciting point high enough to accommodate subsequent coating and drying operations which may be involved in preparing the article, and because it releases from a range of electrically conductive materials and cured elastomeric materials described herein.

The thickness of the release layer 307 is chosen according to the wires 314 to be embedded therein. For example, a wire 314 that is embedded to about 30% of its diameter in the release layer 307 is typically embedded to about 70% of its diameter in any subsequently applied layers applied on the release layer 307.

In some embodiments, the release layer 307 includes an optional dimensionally stable support layer 321, which should not shrink, expand, phase change, etc. during the preparation of the stretchable conductive article. Useful support layers 309 may be thermoplastic, non-thermoplastic or thermosetting, for example. If the support layer is a thermoplastic layer it should preferably have a melting point above that of the thermoplastic release layer of the transfer carrier. Useful support layers for forming the release layer include but are not limited to, those chosen from at least one of paper, polymeric films, and woven or non-woven materials such as biaxially oriented polyethylene terephthalate (PET), polypropylene, polymethylpentene and the like, which exhibit good temperature stability and tensile so they can undergo processing operations such as bead coating, adhesive coating, drying, printing, and the like. In some embodiments, the support layer 321 may optionally include an adhesive layer 323 and protective release liner 325.

In step 302, a first portion 314C of the wire 314 sinks into and embeds in the first major surface 308 of the release layer 307. A second portion 314D of the surface area of the wire 314 remains exposed above the surface 308. To partially embed the wire 314 in the release layer 307, the release layer 307 should preferably be in a tacky state (either inherently tacky and/or by heating). The wire 314 may be partially embedded in the release layer 307, for example, by applying the wire 314 to the surface 308 of the release layer 307, followed by at least one of softening the release layer 307, applying pressure to the wire 314 (with, for example, a roller), or both. The release layer 307 may be softened by any suitable method, including heating, exposure to actinic radiation (for example ultraviolet (UV) light), and the like.

In step 303, a liquid elastomeric precursor material 330 is applied over the first major surface 308 of the release layer 307 at a thickness sufficient to overlie the second surface area portion 314D of the wire 314. The elastomeric precursor material 330 may be selected from any material that can subsequently be converted to a layer of an elastomeric substrate material 312 as shown in step 304. The conversion step may vary widely depending on the elastomeric precursor material, but in some embodiments the conversion step includes heating or exposure to actinic radiation to at least partially cure, or fully cure, the elastomeric precursor material 330 to form the elastomeric substrate material 312.

In step 305, the elastomeric substrate 312 is delaminated and separated from the release layer 307, leaving a second surface area portion 314B of the wire 314 exposed above the first major surface 313A of the substrate 312, while a first surface area portion 314A remains embedded below the surface 313A thereof. In some embodiments, the materials for the elastomeric substrate 312 and the release layer 307 should be selected such that the elastomeric substrate 312 strips away and separates cleanly from the first major surface 308 of the release layer 307, and leaves substantially no residue on the surface 313A of the elastomeric substrate 312 or on the wire 314.

In some embodiments, if the wire 314 is a twisted or braided metal wire, the elastomeric precursor material 330 applied over the wire in step 303 enters the interstices between the metallic strands of the wire 314. When the elastomeric precursor material 330 is subsequently converted to the elastomeric substrate 312 in step 304, the elastomeric material encapsulates and bonds to individual metallic strands of the twisted or braided metal wire 314. In some embodiments, these multiple sites of encapsulation and bonding can enhance the adhesion of the twisted or braided metal wire 314 to the elastomeric substrate 312, and reduce or eliminate de-bonding and de-embedment of the wire 314 from the substrate 312 when the substrate 312 is stretched or otherwise deformed. An example cross-sectional view of a twisted wire with interstitial elastomeric material is shown in FIGS. 1B and 1C.

Figure 4A:
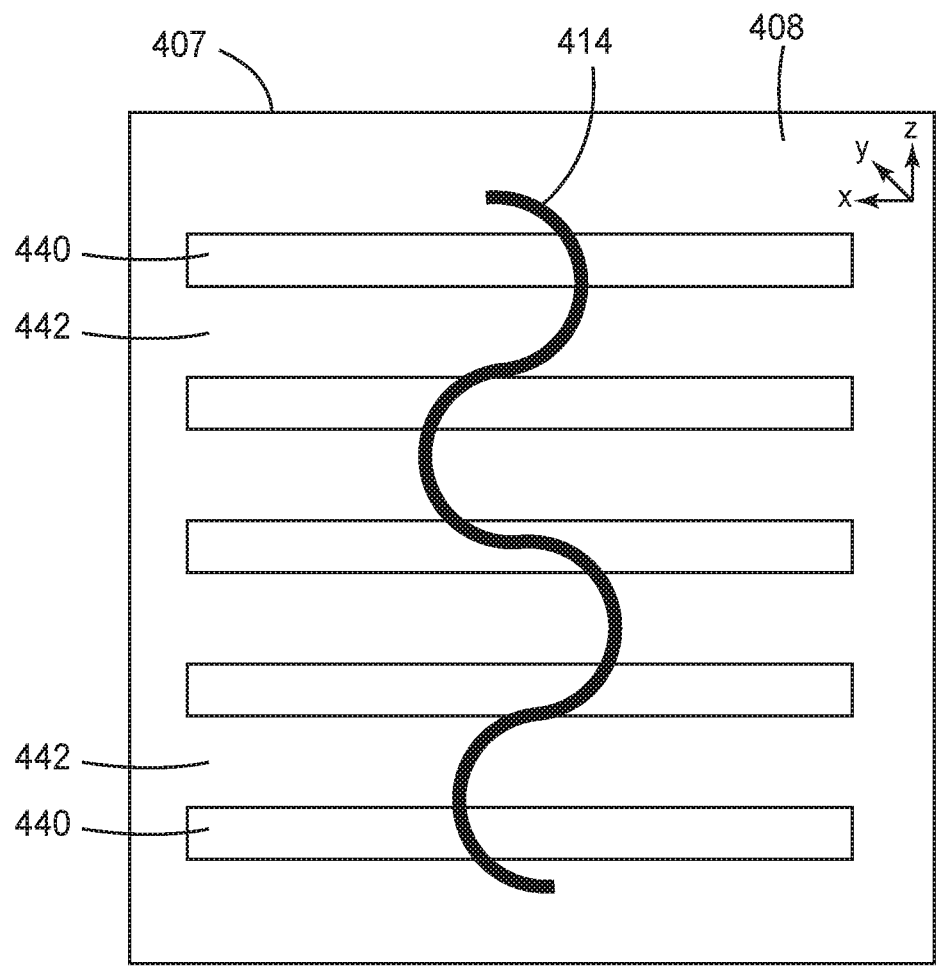
FIG. 4A is a schematic overhead view.

Referring now to the top view of FIG. 4A, a serpentine wire 414 is positioned on a first major surface 408 of a region of a release layer 407. The first major surface 408 of the release layer 407 in the region of FIG. 4A includes a substantially continuous pattern of surface microstructures. In the embodiment of FIG. 4, the surface microstructures include a plurality of substantially embossed or die cut channels 440 between ribs 442 that extend generally along a first axial direction designated x in FIG. 4A. The microstructures 442 need not be continuous over the entire surface 408 of the release layer 407, and the surface 408 may include areas without microstructures. In addition, the ribs need not be parallel as shown in FIG. 4A, but may have any configuration, including random shapes.

FIG. 4A is not to scale, as the average pitch of the microstructures 442 is on the order of about 5 µm to about 300 µm. Although the pitch is preferably substantially the same between all the microstructures 442, such an arrangement is not required, and the microstructures may vary in pitch. In some embodiments, which are provided only as an example, the microstructures 442 have a height along the z direction in FIG. 4A of about 1 µm to about 200 µm as measured from a plane of the first major surface 408 of the release layer 407. While in some embodiments the height of the structures is substantially the same, such an arrangement is not required, and in some embodiments the microstructures 442 may vary in height.

Masters for the tools used for manufacturing the structured surface release layers 407 described herein, whether by extrusion or by a cast and cure process, may be made by known diamond turning techniques. Suitable diamond turning apparatus are shown and described in, for example, U.S. Pat. Nos. 6,322,236; 6,354,709; 7,328,638; and WO/00/48037.

Figure 4B:
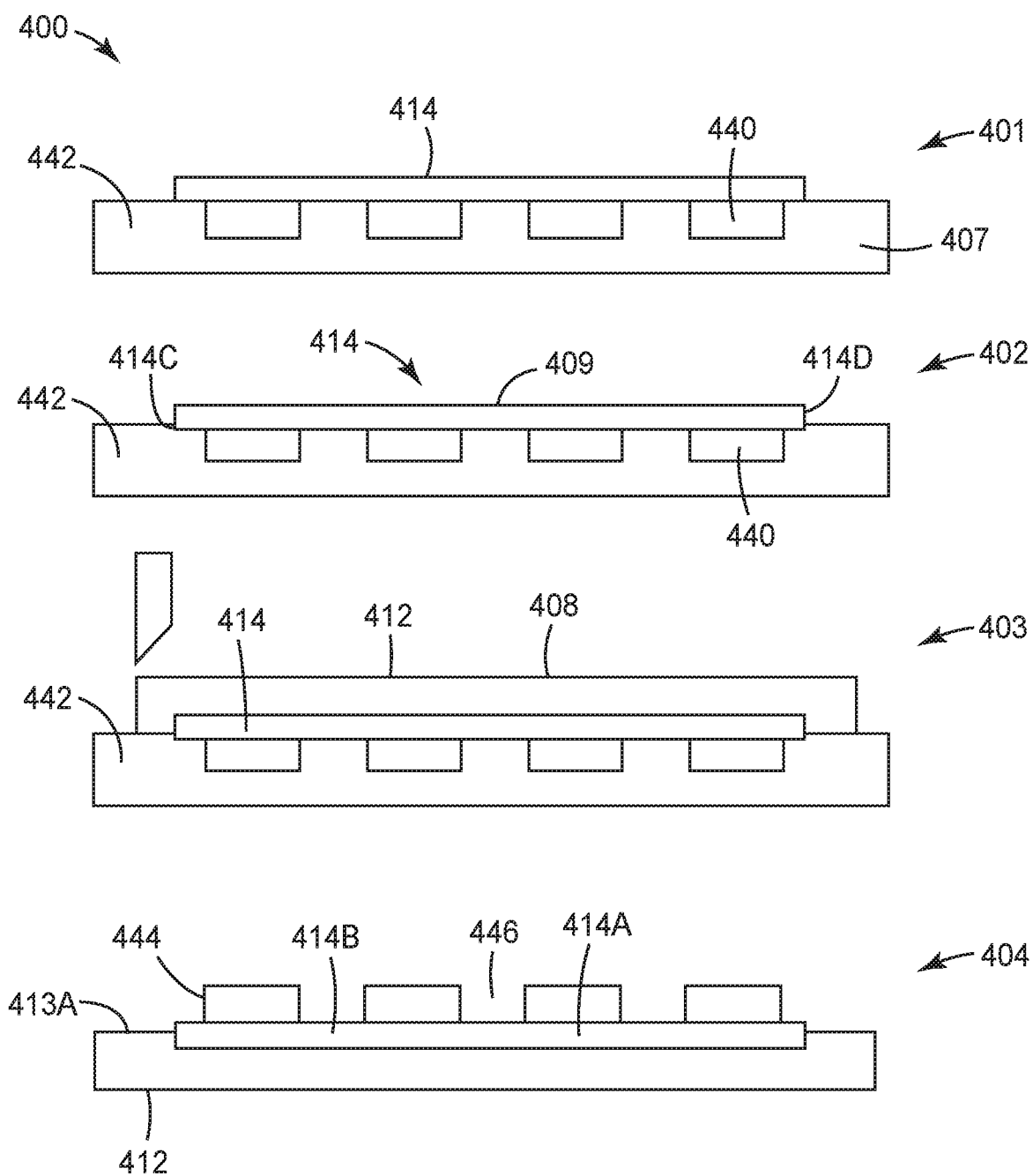
FIG. 4B is a schematic cross-sectional view, of the process for making a stretchable conductor construction according to the present disclosure using an embossed release layer.

FIG. 4B illustrates an embodiment of a process 400 for making a stretchable conductive construction according to the present disclosure. In step 401, a portion of the wire 414 of FIG. 4A is shown on the microstructures 442 of a structured release layer 407.

In step 402, the surfaces 409 of the microstructures 442 are sufficiently softened, or sufficient pressure is exerted on the wire 414, or both, such that a first portion 414C of the wire 414 sinks into and embeds in the top surfaces 409 of the microstructures 442. A second portion 414D of the surface area of the wire 314 remains exposed above the surfaces 409. The microstructures 442 on the release layer 407 may be softened by any suitable method, including heating, exposure to actinic radiation (for example ultraviolet (UV) light), and the like.

In step 403, a liquid elastomeric precursor material is applied over the microstructures 442 such that the elastomeric precursor material enters the channels 440 and rests on the first major surface 408 of the release layer 407 at a thickness sufficient to overlie the second surface area portion 414D of the wire 414. The elastomeric precursor material is then converted to a layer of an elastomeric substrate material 412 by any suitable process such as heating or exposure to actinic radiation to at least partially cure, or fully cure, the elastomeric precursor material to form the elastomeric substrate material 412.

In step 404, the release layer 407 is delaminated and stripped away from the elastomeric substrate 412. The elastomeric substrate 412 includes an arrangement of parallel microstructures 444 formed in the channels 440 of the release layer 407. The microstructures 444 are separated by channels 446, which are formed from the microstructures 442 in the release layer 407.

Removal of the release layer 407 leaves a second surface area portion 414B of the wire 414 exposed in the channels 446 and above the first major surface 413A of the substrate 412, while a first surface area portion 414B remains embedded below the microstructures 444 and the surface 413A. In some embodiments, the partial encapsulation of the wire 414 by the elastomeric microstructures 444 can enhance the robustness of the stretchable conductive film construction.

In some embodiments, the materials for the elastomeric substrate 412 and the release layer 407 should be selected such that the elastomeric substrate 412 separates cleanly from the first major surface 408 of the release layer 407 and leaves substantially no residue on the surface 413A of the elastomeric substrate 412 or on the wire 414. In some embodiments, a residue-free conductor 414 can provide the stretchable conductor construction with enhanced conductivity.

As described above, in some embodiments, the wire 414 is a twisted or braided metal wire. The elastomeric substrate 412 then encapsulates and bonds to individual metallic strands of the metal wire, which can reduce or eliminate de-bonding and de-embedment of the wire from the elastomeric substrate 412 when the substrate 412 is stretched or otherwise deformed.

Figure 5A:
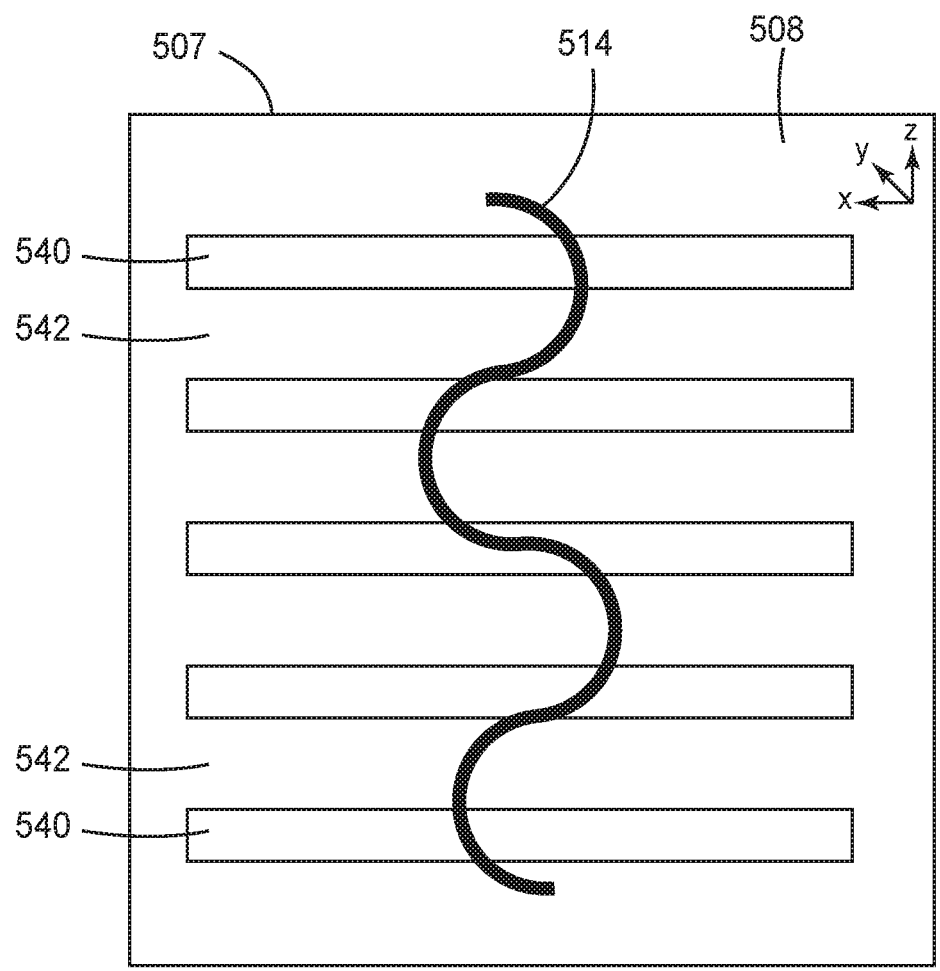
FIG. 5A is a schematic overhead view.

Referring now to the top view of FIG. 5A, a serpentine wire 514 is positioned on a first major surface 508 of a region of a release layer 507. The first major surface 508 of the release layer 507 in the region of FIG. 5A includes a substantially continuous printed pattern of surface microstructures thereon. In the embodiment of FIG. 5A, the surface microstructures include a plurality of substantially linear channels 540 between printed parallel ribs 542 of a passivation (blocking) material that extend along a first axial direction designated x in FIG. 5A and have a substantially constant height. The microstructures 542 need not be continuous over the entire surface 508 of the release layer 507, and the surface 508 may include areas without microstructures.

In some embodiments, the parallel ribs 542 are formed on the surface of the release layer 507 by printing. A variety of printing techniques are suitable, including, but not limited to, flexographic printing, patterned roll coating, letterpress printing, lithography, stencil printing, ink-jet printing and the like. Suitable printers are commercially available from, for example, Exco Technologies Ltd. Of Markham, Ontario, CA.

One particularly suitable method of contact printing is flexographic printing. A flexographic printing apparatus typically includes a flexographic printing plate which may be mounted e.g. onto the exterior surface of a printing cylinder (or which, in some embodiments, may itself be supplied in cylindrical form). An anilox roll may be provided which may receive a liquid into cells of the exterior surface of the anilox roll. Movement (e.g., rotation) of anilox roll and printing cylinder causes the liquid to be transferred (in a metered amount) from cells of the anilox roll, onto printing surfaces of the flexographic printing plate. Continued movement (e.g., rotation) of printing cylinder causes the liquid to be transferred from printing surfaces of flexographic printing plate onto the first major surface of the release layer.

In some embodiments, the flexographic printing plate may be processed as a flat plate to impart it with a desired printing pattern, and then curved and fitted onto the exterior surface of printing cylinder if desired. In some embodiments, the flexographic printing plate may be provided in cylindrical form rather than as a flat plate that may be eventually wrapped around a printing cylinder. In other general types of embodiments, the flexographic printing plate may be provided by molding a flexographic plate precursor material against a master mold whose surface contains a relief pattern that is complementary to the relief pattern that is desired to be provided in plate material. The molding process will thus produce a flexographic plate material with the desired relief structure. Such a plate precursor material may be any suitable flowable (moldable) material, and may be chosen from thermoplastics, or thermoset materials.

Each of the above printing techniques can be used to apply a material to the surface 508 of the release layer 507 in a pattern, either a regular pattern or a random pattern. The material that is applied to the surface of the pressure sensitive adhesive layer can take a wide variety of forms. The material can be a 100% solids composition, a mixture of liquid and solid, a curable composition, or an ink. Compositions that are 100% solids are free or essentially free of solvents. Additionally, a wide variety of material compositions are suitable, for example, the material may comprise an elastomeric material, a thermoplastic material, or a curable material. Curable materials include materials that upon curing are can be thermoset materials, thermoplastic materials, or elastomeric materials.

Exemplary materials include resins, polymeric materials, dyes, inks, vinyl, inorganic materials, UV-curable polymers, pigments, particles, beads and combinations thereof. Particularly suitable are polymeric materials, UV-, and e-beam curable polymeric materials. Among the suitable polymeric materials are olefinic materials such as polyethylene and polypropylene, polyurethane and polyurea materials, (meth)acrylate materials such polymethylmethacrylate (PMMA), polyester materials such as polyethyleneterephthalate (PET), and the like. Examples of UV-curable polymeric materials include a wide range of (meth)acrylate materials. These curable (meth)acrylate materials include (meth)acrylate monomers and oligomers, vinyl functional monomers and oligomers, such as vinyl esters and styrenes, urethane (meth)acrylates, and the like. In some embodiments, the polymeric material may be a heat activated.

The polymeric materials and UV-curable polymeric materials can contain additives or fillers. These additives and fillers can include plasticizing resins, tackifying resins, antibacterial agents, stabilizers (such as thermal or UV stabilizers), colorants (such as pigments and dyes), and particulate fillers such as carbon black, silica, titania, glass microspheres, calcium carbonate, and the like.

The material may be applied to the surface 508 of the release layer 507 in any desired pattern of structures. The pattern may be regular or it may be random. The pattern can comprise structures of a single shape, a variety of shapes, and it can be arranged in such a way that the pattern forms an image.

In various embodiments, the dry thickness of the material applied to the surface 508 of the release layer 507 is small relative to the thickness of the release layer itself. Thus, the dry thickness of the material applied to the surface 508 of the release layer 507 is typically less than 50% of the thickness of the release layer, more typically less than 40% of the thickness of the release layer, or less than 30% of the thickness of the release layer, or even less than 20% of the thickness of the release layer.

After the material is applied to the surface 508 of the release layer 507, additional processing steps may be carried out, such as drying, curing or a combination thereof, depending upon the nature of the material deposited. Drying and/or curing can be carried out through the application of heat, or radiation (such as UV radiation) or by a combination thereof. Heat can be applied, for example, in an oven or with an IR lamp.

FIG. 5A is not to scale, as the average pitch of the microstructured passivation material 542 is on the order of about 50 μm to about 1000 μm. Although the pitch is preferably substantially the same between all the microstructures 542, such an arrangement is not required, and the microstructures may vary in pitch. In some embodiments, which are provided only as an example, the microstructures 542 have a substantially constant height along the z direction in FIG. 5A of about 1 μm to about 20 μm as measured from a plane of the first major surface 508 of the release layer 507. While the height of the structures is substantially the same, such an arrangement is not required, and in some embodiments the microstructures 542 may vary in height.

Figure 5B:
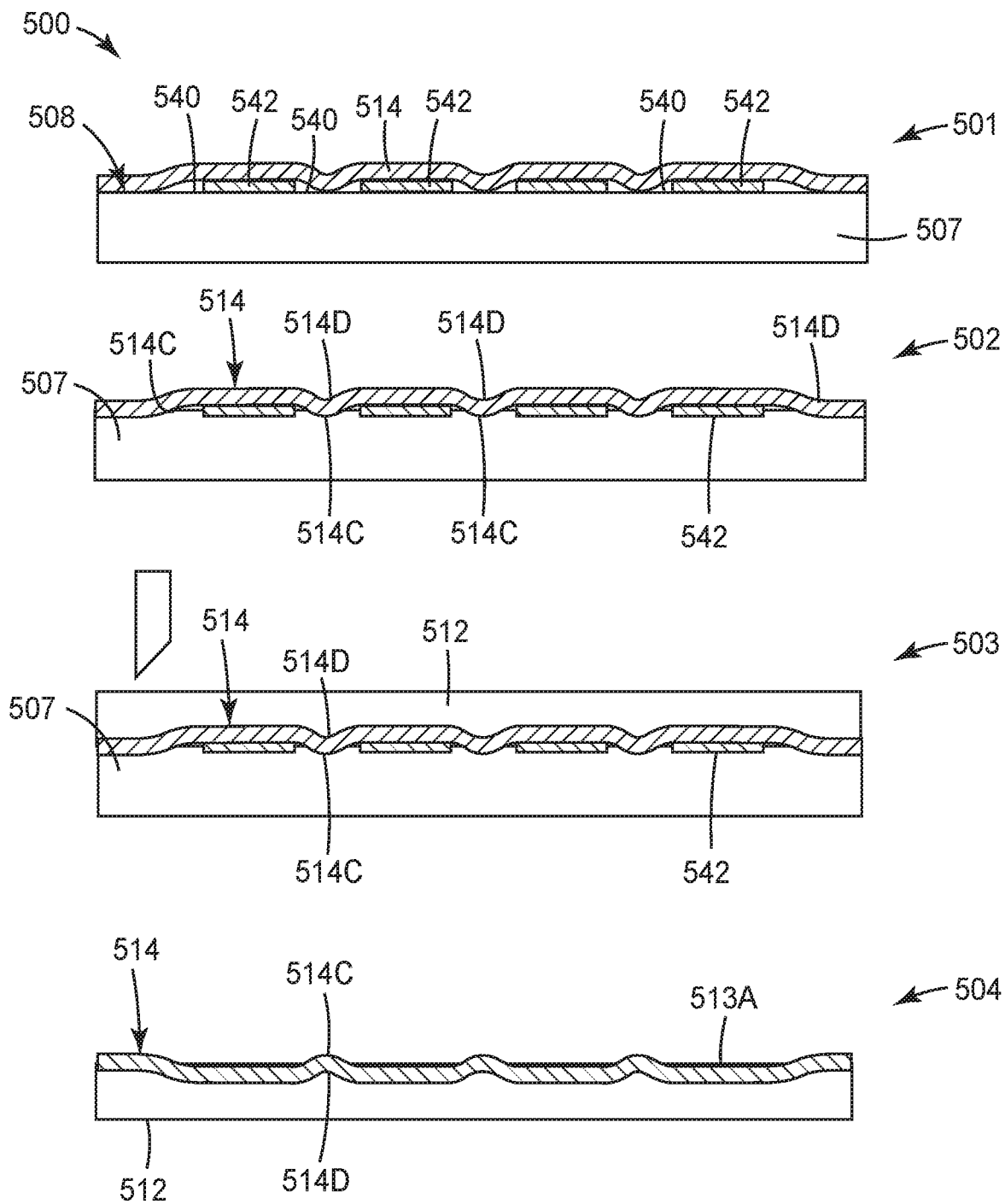
FIG. 5B is a schematic cross-sectional view, of the process for making a stretchable conductor construction according to the present disclosure using a printed release layer.

FIG. 5B illustrates an embodiment of a process 500 for making a stretchable conductive construction according to the present disclosure. In step 501, a portion of the wire 514 of FIG. 5A is shown on the microstructures 542 of the printed structured release layer 507.

In step 502, the surface 508 of the release layer 507 is sufficiently softened such that a first portion 514C of the wire 514 sinks into and embeds in the top surfaces 509 of the microstructures 542. A second portion 514D of the surface area of the wire 514 remains exposed above the surfaces 509. The printed microstructures 542 on the release layer 507 may be softened by any suitable method, including heating, exposure to actinic radiation (for example ultraviolet (UV) light), and the like. However, the microstructures 542 do not soften, and the portions of the wire 514 overlying the structures 542 does not sink into the surface 508, and instead remain on top of the structures 542.

In step 503, an elastomeric precursor material is applied over the wire 514 such that the elastomeric precursor material enters the channels 540 and rests on the first major surface 508 of the release layer 507 at a thickness sufficient to overlie the second surface area portion 514D of the wire 514. The elastomeric precursor material is then converted to a layer of an elastomeric substrate material 512 using any suitable technique such as heating or exposure to actinic radiation to at least partially cure, or fully cure, the elastomeric precursor material to form the elastomeric substrate material 512.

In step 504, the release layer 507 is delaminated and stripped away from the elastomeric layer 512. The delamination of the release layer 507 removes the microstructures 542, which leaves the surface area portion 514C of the wire 514 exposed in the regions originally embedded in the release layer 507, while the regions 514D originally exposed above the release layer 507 are embedded in the elastomeric layer 512.

In some embodiments, the materials for the elastomeric substrate 512 and the release layer 507 should be selected such that the elastomeric substrate layer 512 separates cleanly from the first major surface 508 of the release layer 507 and leaves substantially no residue on the surface 513A of the elastomeric substrate 512 or on the wire 514, which can enhance the conductivity of the resulting construction.

In some embodiments, the wire 514 is a twisted or braided metal wire. The elastomeric substrate 512 encapsulates and bonds to individual metallic strands of the wire, which can reduce or eliminate de-bonding and de-embedment of the wire from the elastomeric substrate 512 when the substrate 512 is stretched or otherwise deformed.

In various embodiments, the stretchable conductor constructions described herein can be used in a wide variety of conformable or stretchable electronic systems. For example, the stretchable conductor constructions can be laminated to or sewn into a fabric of a garment such as a shirt, vest, coat, socks, pants, undergarments and the like. In various example embodiments, which are not intended to be limiting, the stretchable conductor constructions can be a component of a conformal sensor system including any one or more of a temperature sensor, a neuro-sensor, a hydration sensor, a heart sensor, a flow sensor, a pressure sensor, an equipment monitor (e.g., smart equipment), a respiratory rhythm monitor, a skin conductance monitor, an electrical contact, or any combination thereof, including a multifunctional sensor, such as but not limited to a temperature, strain, and/or electrophysiological sensor, a combined motion-/heart-/neuro-sensor, a combined heart-/temperature-sensor, and the like.

In some embodiments, the stretchable conductive constructions described herein can be used in molded electronics for automotive or aerospace cabin interiors, or to sense the presence of an occupant in a seat.

Figure 6:
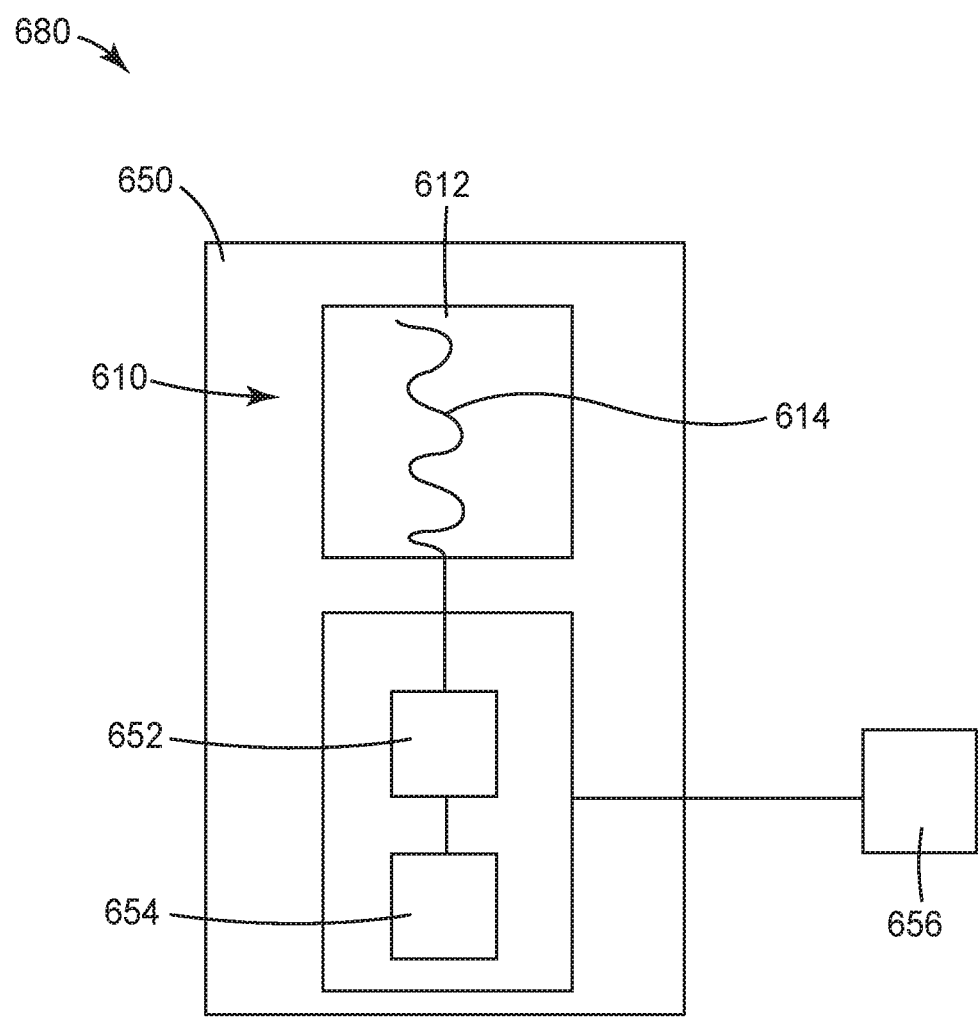
FIG. 6 is a schematic diagram of an embodiment of a device configuration incorporating the stretchable conductor constructions of the present disclosure.

FIG. 6 is shows an example device 680 including a fabric substrate 650 with a stretchable conductor construction 610 mounted or sewn thereon. The stretchable conductor construction 610 includes an elastomeric substrate 612 with at least one randomly winding wire 614 partially embedded therein. The wire 614 is electrically connected to one or more sensors 652, 654, which are in turn connected to one or more electronic devices 656 such as, for example, an analyzer, a transmission module, a data storage device, a processor, an indicator, a display, and the like.

For example, a transmission module can be configured to transmit data from the sensors 652, 654, to the analyzer, to the storage device, to an external memory, or to another storage device, a network, and/or an off-board computing device. In one example, the transmission module is a wireless transmission module that can be used to transmit data via wireless networks, radio frequency communication protocols, Bluetooth®, near-field communication (NFC), and/or optically using infrared or non-infrared LEDs. The data can be transmitted to an external memory or other storage device, a network, and/or an offboard computing device.

Figure 10:
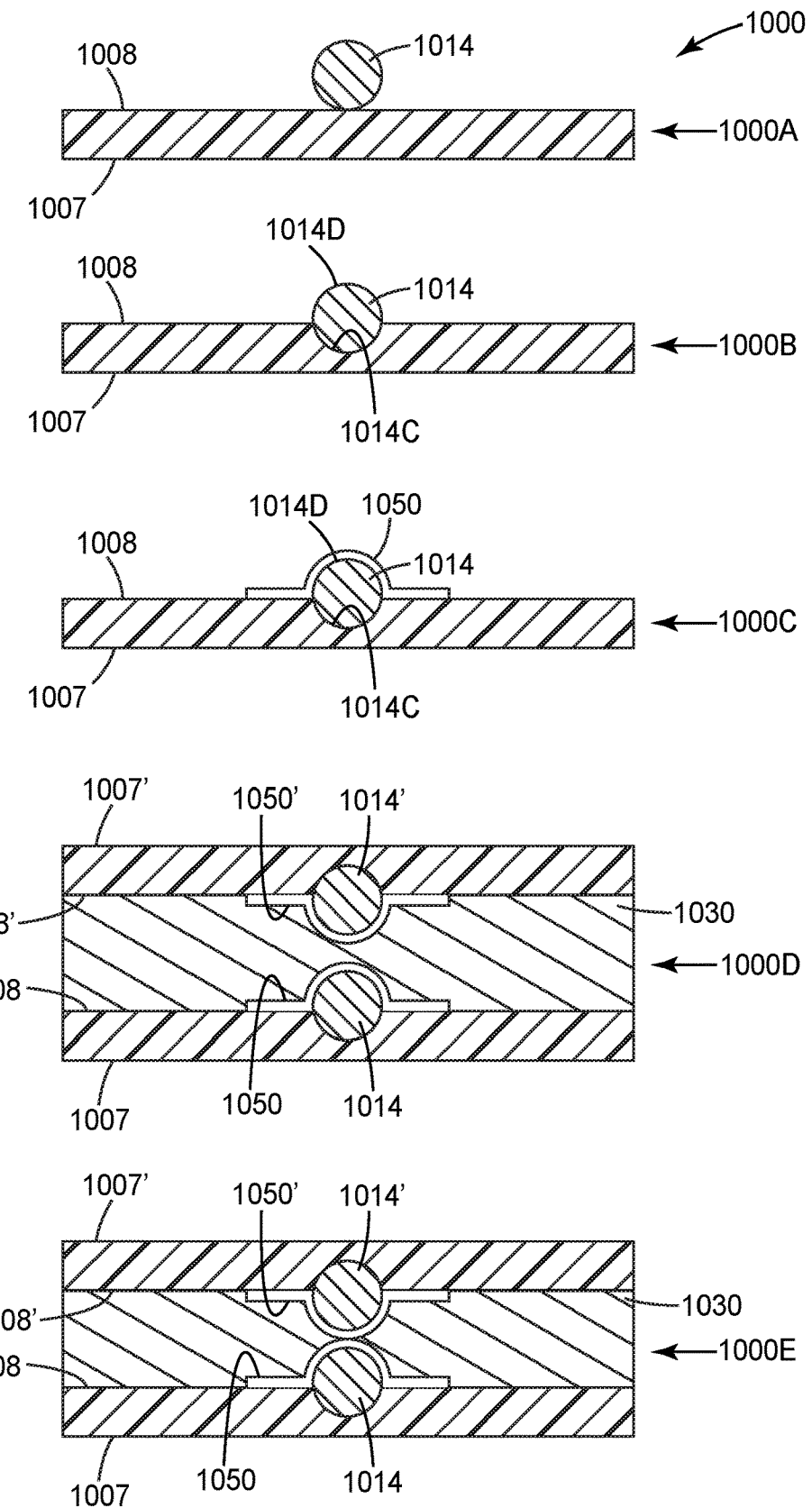
FIG. 10 is a schematic diagram of a process for making an alternate embodiment of a stretchable conductor construction according to the present disclosure.

FIG. 10 illustrates an embodiment of a process 1000 for making an alternate embodiment of a stretchable conductive construction according to the present disclosure. In step 1000A, a winding wire 1014 contacts a first major surface 1008 of a release layer 1007. In step 1000B, a first portion 1014C of the wire 1014 sinks into and embeds in the first major surface 1008 of the release layer 1007. A second portion 1014D of the surface area of the wire 1014 remains exposed above the surface 1008. To partially embed the wire 1014 in the release layer 1007, the release layer 1007 should preferably be in a tacky state (either inherently tacky and/or by heating). The wire 1014 may be partially embedded in the release layer 1007, for example, by applying the wire 1014 to the surface 1008 of the release layer 1007, followed by at least one of softening the release layer 1007, applying pressure to the wire 1014 (with, for example, a roller), or both. The release layer 1007 may be softened by any suitable method, including heating, exposure to actinic radiation (for example ultraviolet (UV) light), and the like.

In step 1000C a layer of a stretchable conductive film 1050 is placed over at least a portion of wire 1014. In step 1000D, a liquid elastomeric precursor material 1030 is applied over the first major surface 1008 of the release layer 1007 at a thickness sufficient to overlie the second surface area portion 1014D of the wire 1014. The elastomeric precursor material 1030 may be selected from any material that can subsequently be converted to a layer of an elastomeric substrate material 1012 as will be discussed in connection with step 1000F. A second instance of the construction of step 1000C has been disposed within elastomeric precursor material 1030, with wire 1014' oriented towards wire 1014, and release layer 1007' oriented away from wire 1014.

In step 1000E, a gentle force has been applied (with, for example, a roller) so as to urge release layer 1007 towards release layer 1007', and also to cause stretchable conductive film 1050 into electrical contact with stretchable conductive film 1050'. In step 1000F, the elastomeric precursor material 1030 has been cured to form an elastomeric substrate material 1012. In step 1000G, elastomeric substrate 1012 is delaminated and separated from both release layer 1007 and 1007', leaving a second surface area portion 1014C of wire 1014 and second surface area portion 1014C' of the wire 1014' exposed on opposite sides of elastomeric substrate 1012.

Figure 11:
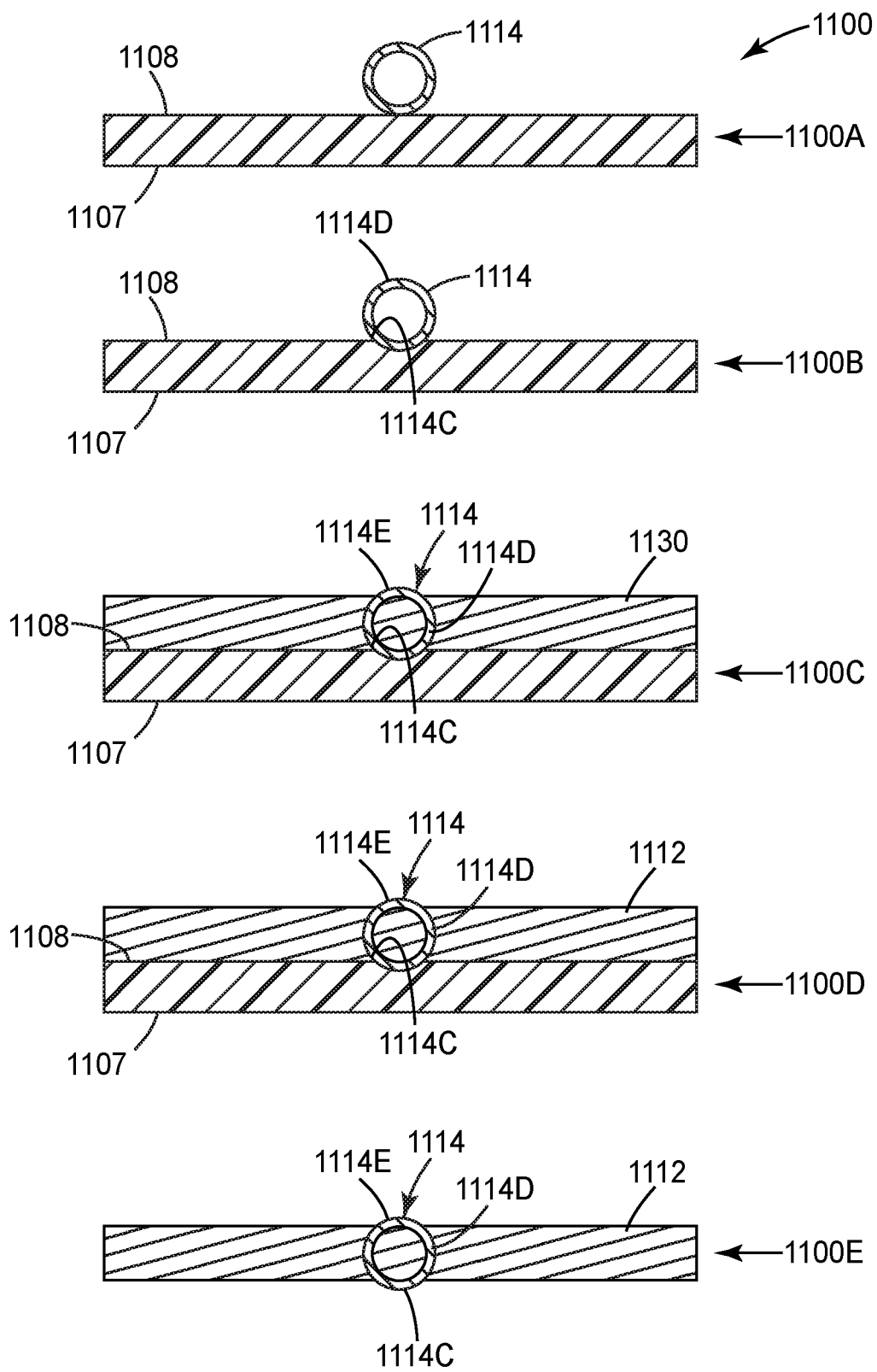
FIG. 11 is a schematic diagram of a process for making an alternate embodiment of a stretchable conductor construction according to the present disclosure.

FIG. 11 illustrates an embodiment of a process 1100 for making an alternate embodiment of a stretchable conductive construction according to the present disclosure. In step 1100A, a wire 1114 (illustrated in this view as spiral wound) contacts a first major surface 1108 of a release layer 1107. In step 1100B, a first portion 1114C of the wire 1114 sinks into and embeds in the first major surface 1108 of the release layer 1107. A second portion 1114D of the surface area of the wire 1114 remains exposed above the surface 1108.

To partially embed the wire 1114 in the release layer 1107, the release layer 1107 should preferably be in a tacky state (either inherently tacky and/or by heating). The wire 1114 may be partially embedded in the release layer 1107, for example, by applying the wire 1114 to the surface 1108 of the release layer 1107, followed by at least one of softening the release layer 1107, applying pressure to the wire 1114 (with, for example, a roller), or both. The release layer 1007 may be softened by any suitable method, including heating, exposure to actinic radiation (for example ultraviolet (UV) light), and the like.

In step 1100C a liquid elastomeric precursor material 1130 is applied over the first major surface 1108 of the release layer 1107 at a thickness sufficient to overlie the second surface area portion 1114D of the wire 1114. The elastomeric precursor material 1130 may be selected from any material that can subsequently be converted to a layer of an elastomeric substrate material 1112 as will be discussed in connection with step 1100D. The thickness of elastomeric precursor material 1130 is deliberately chosen to leave a third portion 1114E of wire 1114 uncovered.

In step 1100D, the elastomeric precursor material 1130 has been cured to form an elastomeric substrate material 1112. In step 1100E, elastomeric substrate 1112 is delaminated and separated from both release layer 1107, leaving a second surface area portion 1114C and third surface area portion of wire 1114 exposed on opposite sides of elastomeric substrate 1112.

Figure 12A:
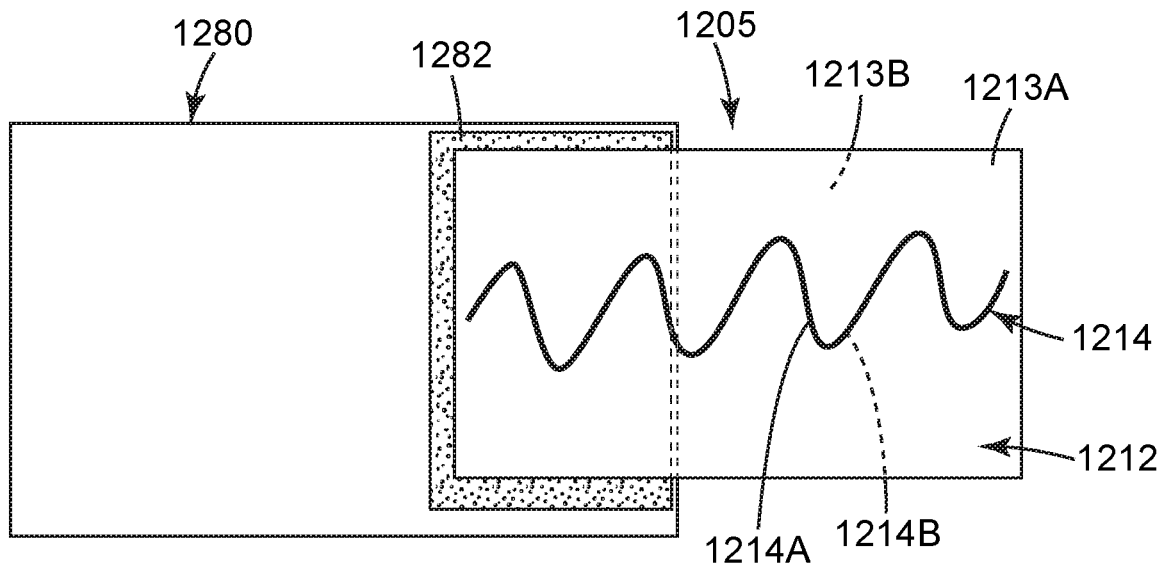
FIG. 12A is a plan view of a stretchable conductor according to the present disclosure, bonded to a portion of conductive fabric.

FIG. 12A illustrates a stretchable conductor 1205 bonded to a portion of conductive fabric 1280. In the illustrated embodiment, a stretchable conductor 1205 is similar to the embodiment depicted in FIG. 3. Wire 1214 is partially embedded elastomeric substrate 1212, with second surface area portion 1214B of the wire 1214 exposed above the first major surface 1213B of the substrate 1212 (on the far side of the construction as depicted), while a first surface area portion 1214A remains embedded below the surface 1213A thereof (on the near side of the construction as depicted. A layer of non-conductive adhesive 1282 is positioned between first major surface 1213B and conductive fabric 1280. When this construction is fabricated correctly, e.g., as discussed below in connection with Example X, the connection between first major surface 1213B and conductive fabric 1280 is electrically continuous.

Figure 12B:
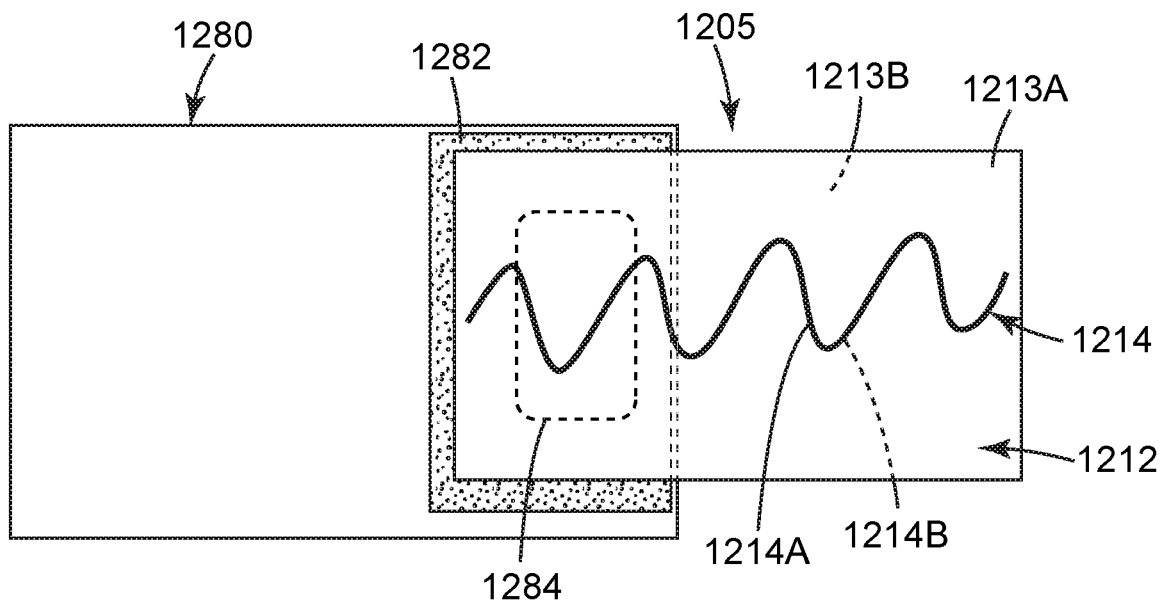
FIG. 12B is a plan view of an alternate embodiment of a stretchable conductor according to the present disclosure, bonded to a portion of conductive fabric.

FIG. 12B illustrates an alternate embodiment of a stretchable conductor 1205 bonded to a portion of conductive fabric 1280. Otherwise similar to the embodiment of FIG. 12A, in this embodiment a portion of a conductive film is interposed between at least a portion of conductive fabric 1280 and first major surface 1213B.

The operation of the apparatus and processes of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Materials

Unless otherwise noted, all parts, percentages, ratios, etc. in the Examples and the rest of the specification are by weight. Solvents and other reagents used may be obtained from Sigma-Aldrich Chemical Company (Milwaukee, Wis.) unless otherwise noted. In addition, Table 1 provides an abbreviated identifier and a source for all materials used in the Examples below:

TABLE 1

| Identifier | Description and Source |
| --- | --- |
| PY4122 | A flexible, difunctional bis-phenol A based epoxy resin having an epoxy equivalent weight of 313 to 390 grams/equivalent and the majority (at least 60 wt %) which is 2,2'-[(1-methylethylidene)bis[4,1-phenyleneoxy[1-(butoxymethyl)ethylene]oxymethylene]]bisoxirane, available under the trade designation ARALDITE PY 4122 Resin from Huntsman Corporation, The Woodlands, TX. |
| | $H_9C_4O$ — (structural formula) — $OC_4H_9$ |
| MX150 | A general purpose Bisphenol A epoxy resin containing 40 weight % of polybutadiene (PBd) core-shell rubber (CSR) particles, available under the trade designation KANE ACE MX-150 from Kaneka Corporation, Tokyo, Japan. |
| Z6040 | Glycidylpropyl trimethoxysilane, an adhesion promoter available under the trade designation DOW CORNING Z-6040 SILANE from Dow Corning Corporation, Midland, MI. |
| L07N | An Epoxy-Phenol-Borate compound, a viscous liquid which is described as an Adduct Stabilizer used to provide improved storage stability to epoxy resins containing adducted imidazole and amine curing agents, available under the trade designation SHIKOKU L-07N from Shikoku Chemicals Corporation, Marugame, Kagawa Prefecture, Japan. |
| CE10P | The glycidyl ester of versatic acid 10, a synthetic saturated monocarboxylic acid of highly branched C10 isomers available under the trade designation CARDURA E10P GLYCIDYL ESTER from Hexion Incorporated, Columbus, OH. |
| FXR 1081 | A latent epoxy curing agent and curing accelerator, available under the trade designation FUJICURE FXR-1081 from T&K Toka Corporation, Iruma-Gun, Saitama, Japan. |
| TMPMP | Trimethylolpropane tris(3-mercaptopropionate), a trifunctional polythiol, curing agent having a molecular weight of 399 grams/mole, available under the trade designation THIOCURE TMPMP from Evans Chematics, Teaneck, NJ. |
| Sylgard 184 | A colorless, two-part (10:1 mix ratio), polydimethyl siloxane elastomer available from Dow Corning Corporation, Midland, MI. |
| Silicone Rubber 1 | A high consistency rubber silicone-rubber based polymer that is the product of a platinum catalyzed addition cure of vinyl-functional polydimethylsiloxane and methyl hydrogen polysiloxane, formulated with silica filler, black pigment, polytetrafluoroethylene micropowder, and heat stabilizers, and having a Shore D hardness of 35 and a thickness of 0.043 inches (1.1 millimeters). The silicone rubber substrate was corona treated no more than two weeks before use. |
| MPD | 3-methyl-1,5 pentanediol, available under the trade designation MPD from Kuraray America, New York, NY. |
| C2090 | A polycarbonate polyol based on MPD and 1,6 hexanediol with a molecular weight of 2000 and an OH value of 56, available under the trade designation C2090 from Kuraray America, New York, NY |
| DESMODUR W | A liquid cycloaliphatic diisocyanate, dicyclohexylmethane diisocyanate, having an equivalent weight of 132 maximum, an NCO content of 31.8% minimum, and a solidification point of 25° C., from Bayer Materials Science LLC, Pittsburgh, PA. This material was vacuum degassed at 70° C. prior to use. |

TABLE 1-continued

| Identifier | Description and Source |
|---|---|
| DESMODUR N3300A | A solvent free, polyfunctional, aliphatic isocyanate resin based hexamethylene diisocyanate (HDI) having an equivalent weight of approximately 193, an NCO content of 21.8%, and a monomeric HDI content of 0.2% maximum, from Bayer Materials Science LLC, Pittsburgh, PA. This material was vacuum degassed at 70° C. prior to use. |
| K-FLEX 188 | A liquid aliphatic polyester polyol, having a hydroxyl number of 230 and a hydroxyl equivalent weight of 244, from King Industries Specialty Chemicals, Norwalk, CT. This material was vacuum degassed at 70° C. prior to use. |
| T12 | DABCO T-12 catalyst, dibutyltin dilaurate (DBTDL), a liquid catalyst, Air Products and Chemicals, Incorporated, Allentown, PA. |
| MEK | Methyl Ethyl Ketone |
| PC | A clear polycarbonate film having a glass transition temperature of 153° C., available under the trade designation "LEXAN 8010" from SABIC Innovative Plastics, Pittsfield, MA. |

Corona Treatment of Silicone Substrates

Silicone rubber substrates were corona treated under an ambient air atmosphere at a power level of 0.2 kilowatts and a feed rate of 30 feet/minute (9.1 meters/minute) to provide a total dosage of 0.32 Joules/square centimeter using a Model SS1908 Corona Treater from Enercon Industries Corporation, Menomonee Falls, Wis. The silicone rubber substrates were corona treated no more than two weeks before use.

Stretch Test Method

Stretch testing of stretchable conductive films was performed with a tensile tester available from Instron Corp., Norwood, Mass., under the trade designation Mini 55 with a 50 N static load cell (Cat. #2530-471). The test samples were 1 inch wide, approx. 3 inches long. The samples were clamped into the tester with pneumatic clamps supplied with 75 psi compressed air, and arranged so that the length of exposed sample between the clamps measured 1.25 inches. The samples were then subjected to a cyclic tensile strain test (written in the Bluehill 2 v2.33 software) for a predetermined number of cycles where each cycle consisted of the sample being stretched to a maximum desired strain percentage (i.e. 20%, 40%, 60%, etc.) at a strain rate of 40%/second and then returned to its original length at the same rate in a triangle ramp. The Bluehill software was set to capture and output values for time, extension, load, tensile strain, and tensile stress at the default data rate of 500 Hz (the default mode of the tester used captured data via two channels—time at a 0.002 second time interval, or load at a load interval of 0.025 lbf).

Example 1 Methods of Making Stretchable Conductor Transfer Article

Example 1A—Conductor Carrier Made Using Bare Wire

A meander pattern was created using an 8-mil (0.20 mm) diameter stainless steel wire (California Fine Wire company). The amplitude of the meander was 3 mm and the spacing between two consecutive crests or troughs was 5 mm. The wire, serving as a conductor, was heat sunk into a transfer carrier including a polyethylene coated PET substrate which had been preheated to about 140° C. (284° F.), to form a conductor carrier having bare wire embedded in the polyethylene layer to a depth corresponding to about 25-30 microns, as determined by a magnifying imaging system.

Example 1B—Conductor Carrier Made Using Multi-Turn Wire

A meander pattern was created using a 7-turn Cu wire (California Fine Wire Company). The diameter of individual wire was 2 mils (0.05 mm) and total average diameter of the 7-turn wire was 3.5 mils (0.09 mm). The amplitude of the meander was 3 mm and the spacing between two consecutive crests or troughs was 5 mm. The wire, serving as a conductor, was heat sunk into a transfer carrier comprising a polyethylene coated PET substrate which had been preheated to about 140° C. (284° F.), to form a conductor carrier having bare wire embedded in the polyethylene layer to a depth of 25-30 microns, as determined by a magnifying imaging system.

Example 1C—Conductor Carrier Made Using Stainless Steel Thread Wound Around Cu Wire A meander pattern was created using a conductor made by manually winding a stainless steel thread around a 6 mil (0.15 mm) Cu wire. The amplitude of the meander was 3 mm and the spacing between two consecutive crests or troughs was 5 mm. The wire, serving as a conductor, was heat sunk into a transfer carrier including a polyethylene coated PET substrate which had been preheated to about 140° C. (284° F.), to form a conductor carrier having bare wire partially embedded in the polyethylene layer.

Example 1D—Conductor Carrier Made Using Carbon Thread

A meander pattern was created using a 10-mil (0.25 mm) diameter carbon thread. The wire, serving as a conductor, was heat sunk into a transfer carrier comprising a polyethylene coated PET substrate which had been preheated to about 140° C. (284° F.), to form a conductor carrier having bare wire partially embedded in the polyethylene layer.

Example 1E—Conductor Carrier Made Using Bare Stainless Wire on Structured Polyethylene Coated PET A meander pattern was created using an 8-mil (0.20 mm) diameter stainless steel wire (California Fine Wire Company). The amplitude of the meander was 3 mm and the spacing between two consecutive crests or troughs was 5 mm. The wire, serving as a conductor, was heat sunk into a transfer carrier comprising channels (width=1 mm, height=0.1 mm) perpendicular to the wire meander direction were embossed in polyethylene coated PET substrate at room temperature. The wire meander was heat sunk into the structured polyethylene coated PET substrate which had been preheated to about 140° C. (284° F.), to form a conductor carrier having a portion of the wire meander (not sitting on top of the channels) partially embedded in the polyethylene layer.

Example 1F—Conductor Carrier Made Using Bare Stainless Wire on Polyethylene Coated PET with Printed Passivation Features A meander pattern was created using an 8-mil (0.20 mm) diameter stainless steel wire (California Fine Wire Company). The amplitude of the meander was 3 mm and the spacing between two consecutive crests or troughs was 5 mm. The wire, serving as a conductor, was heat sunk into a polyethylene coated PET transfer carrier comprising of printed passivation lines perpendicular to the wire meander direction. The passivation lines were created by screen printing a UV curable ink (Nazdar 3500 UV Durable Graphic Screen Ink) onto the polyethylene coated PET. The wire meander was heat sunk into the printed polyethylene coated PET substrate which had been preheated to about 140° C. (284° F.), to form a conductor carrier having a portion of the wire meander (not sitting on top of the printed passivating lines) partially embedded in the polyethylene layer.

Example 2

A 90% solids two-part polyurethane in MEK solution was prepared by adding the following vacuum degassed materials to a MAX 60 Speedmixer cup (FlackTek Inc, Landrum, S.C.): 0.41 grams of Desmodur N3300A, 3.63 grams Desmodur W, 15.64 grams of a mixture of C2090:MPD/95:5, (w/w). Vacuum was applied directly to the cup for 15 seconds and then mixed at 2600 rpm for 45 seconds under full vacuum in a DAC 150.1 FVZ-K Speedmixer (FlackTek Inc, Landrum, S.C.). The mixture was then removed from the mixer and 18 microliters T12 (DABCO T12) was added using a micropipette. The cup was again placed under vacuum for 15 seconds and mixed for an additional 45 seconds at 2600 rpm under full vacuum. The resulting mixture was applied on top of the conductor carrier as described in Example 1B, measuring 30.5 centimeters (12 inches) wide, using a notchbar coater by setting an 8 mil (0.20 mm) gap between the top of the wire and the coating knife at a rate of about 3.0 meters/minute. The coated precursor was cured at 80° C. for 1 hour. A transfer laminate article having wires which were partially embedded in polyethylene on one side and in the polycarbonate-based polyurethane resin on the other side was obtained. Removal of the liners provided a free-standing polycarbonate-based polyurethane film with embedded copper wire braid having a thickness of 0.007 inches (0.18 mm). The sample was subjected to stretch test (1000 stretch cycles at 40% elongation). No physical defects such as tear or delamination were observed in the samples before and after the test. The resistance measured using a Keithley 2000 multimeter before and after the test was 10.1Ω and 10.2Ω, respectively.

Example 3

50.02 g of Sylgard were mixed with 5.01 g of curing agent in a 100 g speed mixing cup (FlackTek Inc, Landrum, S.C.) and mixed at 2800 rpm for 1 min to make the mixture batch. The resulting mixture was applied between a polyethylene coated polyester film release liner and conductor carrier as described in Example 1B, both measuring 30.5 centimeters (12 inches) wide, using a notchbar coater by setting a 9 mil (0.23 mm) gap between the top of the wire and the coating knife at a rate of about 3.0 meters/minute. The coated precursor was cured at cured at 100° C. for 1 hour. A transfer laminate article having wires which were partially embedded in polyethylene on one side and in the cured silicone resin on the other side was obtained. Removal of the liners provided a free-standing silicone film with embedded copper wire braid having a thickness of 0.01 inches (0.25 mm). The sample was subjected to stretch test (1000 stretch cycles at 20% elongation) and was found to show no degradation in physical and electrical properties.

Example 4

One part epoxy resin bonding composition was prepared using the materials and amounts shown in Table 2 as follows. The materials, except for FXR 1081, were added to a MAX 60 SPEEDMIXER cup (FlackTek, Incorporated, Landrum, S.C.) and mixed at 1,500 rpm for one minute using a DAC 600 FVZ SPEEDMIXER (FlackTek, Incorporated, Landrum, S.C.). To each mixture was then added FXR 1081 followed by further mixing at 1,500 rpm for one minute to obtain an uncured epoxy resin bonding composition.

TABLE 2

| Uncured Epoxy Resin Bonding Compositions | | | | | | |
|---|---|---|---|---|---|---|
| PY4122 | MX150 | Z6040 | L07N | CE10P | FXR1081 | TMPMP |
| 38.11 | 11.83 | 1.77 | 3.54 | 8.81 | 8.88 | 27.06 |

The uncured epoxy resin composition was then applied onto the surface of the conductor carrier as described in Example 1B, measuring 6 inches wide by 8 inches long (15.2 centimeters by 20.3 centimeters) using a knife coating apparatus to provide a coated thickness of 0.020 inches (0.50 mm). Prior to application, a one inch (2.5 cm) area along the width at one end of the sheet was taped off to prevent this area from being coated with composition. After application, a release liner was pressed against the uncured epoxy resin composition. This assembly was then cured for one hour at 80° C. in an oven. Removal of the release liners provided a free-standing flexible epoxy film on a silicone backing with embedded copper wire braid having a thickness of 0.020 inches (0.51 mm). The sample was subjected to stretch test (1000 stretch cycles at 40% elongation) and was found to show no degradation in physical and electrical properties. The sample was subjected to stretch test (1000 stretch cycles at 20% elongation) and was found to show no degradation in physical and electrical properties.

Example 5—Epoxy with Silicone Backing

One part epoxy resin bonding composition was prepared using the materials and amounts shown in Table 3 as follows. The materials, except for FXR 1081, were added to a MAX 60 SPEEDMIXER cup (FlackTek, Incorporated, Landrum, S.C.) and mixed at 1,500 rpm for one minute using a DAC 600 FVZ SPEEDMIXER (FlackTek, Incorporated, Landrum, S.C.). To each mixture was then added FXR 1081 followed by further mixing at 1,500 rpm for one minute to obtain an uncured epoxy resin bonding composition.

TABLE 3

Uncured Epoxy Resin Bonding Compositions

| PY4122 | MX150 | Z6040 | L07N | CE10P | FXR1081 | TMPMP |
|--------|-------|-------|------|-------|---------|-------|
| 38.11  | 11.83 | 1.77  | 3.54 | 8.81  | 8.88    | 27.06 |

The uncured epoxy resin composition was then applied onto the corona treated surface of a silicone sheet (Silicone Rubber 1) measuring 6 inches wide by 8 inches long (15.2 centimeters by 20.3 centimeters) and having a thickness of around 0.040 inches (1.02 mm) using a knife coating apparatus to provide a coated thickness of 0.011 inches (0.28 mm). Prior to application, a one inch (2.5 cm) area along the width at one end of the sheet was taped off to prevent this area from being coated with composition. After application, conductor carrier as described in Example 1B was pressed against the uncured epoxy resin composition. This assembly was then cured for one hour at 80° C. in an oven. Removal of the release liners provided a free-standing flexible epoxy film on a silicone backing with embedded copper wire braid having a thickness of 0.051 inches (1.30 mm). The sample was subjected to stretch test (1000 stretch cycles at 20% elongation) and was found to show no degradation in physical and electrical properties.

Example 6—Thermoforming of Laminates

Films as described in Example 2, measuring 20.3 cm (8 inches) square were thermoformed using a COMET thermoformer (model C32.5S, MAAC Machinery Corporation, Carol Stream, Ill.). A male test mold having a 6.35 cm (2.50 inches) square base, a height of 1.27 cm (0.5 inches), and various radii and draft angles to its vertical sides was used to form into shape a polycarbonate film, which was then used as a backing over which stretchable conductor films were formed. The following parameters were employed. The sheet temperature just before molding was measured using a laser sight equipped, portable non-contact (infrared) thermometer, commercially available under the trade designation "Scotchtrak Infrared Heat Tracer IR-16L3" from 3M Company, St. Paul, Minn.

The thermoforming parameters used to form the laminate were pressure box working pressure of 0.31 MPa (45 PSI), a measured sheet temperature immediately before thermoforming of 171-188° C. (340-370° F.), and a mold temperature of 32-35° C. (90-95° F.).

Example 7

A soldering iron (Weller WX2021 Soldering Iron, Apex Tool Group, Sparks, Md., USA) was used to solder a wire (PVC Hookup Wire, 0.23 mm diameter, Belden) onto the stretchable conductive substrate, as described in Example 5. The solder bond was found to be robust with no visible degradation of the epoxy substrate.

Example 8

Access holes (diameter: 1 cm) were die cut into a PU film (Bemis 3916 Sewfree tape) and heat laminated to the stretchable conductive film described in example 2, in a way that the access holes lined up with the wire. A circular dot (diameter: 0.8 cm) of an anisotropic conductive film (ACF, 3M 9707) was attached to the wire inside the access hole. A metallic snap connector (09864 snap mounting, Newark) was then bonded to the ACF film by manually pressing it down. The gap around the ACF film was then sealed using an epoxy potting (3M Scotch-weld Epoxy Adhesive DP420) material. This resulted in a construction that protected the wire in the stretchable conductive film and the ACF connector from degradation due to moisture and other chemicals.

Example 9

A stretchable conductor was formed by a process generally as described in connection with FIG. 10. A stainless steel single stranded metal wire was placed into contact with a release liner comprising a 0.001 inch (0.025 mm) thick coating of polyethylene on a 0.004 inch (0.10 mm) thick polyethylene phthalate film. The liner was heated to a temperature above the melting point of the PE but below the melting point of PET (approx. 138-149° C.), and a portion of the wire was sunk into the liner. Next, a thin strip of conductive, stretchable film commercially available as ACF 9707 from 3M Company was placed over a portion of the wire, forming a first subassembly. A second instance of this subassembly was then prepared The first subassembly was then overcoated with a thin layer of poly(dimethyl siloxane) commercially available as SYLGARD-184 from Dow Chemical. The second subassembly was then gently laminated on top of the first wire so that the strips of conductive, stretchable film were placed into contact with one another, squeezing out the uncured polymer from that connection point, but leaving a layer of uncured polymer everywhere else between the two liners. Finally, the polymer was cured into a stretchable polymer with UV radiation, and the liners were stripped from both sides of the sample to reveal an exposed wire meander on either side of a polymer layer with an electrical connection between the two wires established by contact between the two strips of conductive, stretchable film.

Example 10

A stretchable conductor was fabricated generally as described in Example 1A, except that the wire was a composite wire composed of three 0.076 mm diameter copper wires twisted together. A swatch of conductive fabric commercially available as Knit Conductive Fabric P1167 from Adafruit Industries of New York, N.Y. was obtained. A small portion of non-conductive epoxy adhesive commercially available as SCOTCH-WELD XA-007-3481-9 One Part Epoxy Adhesive 6100LV Off-White from 3M Company of St. Paul, Minn., was disposed upon the conductive fabric. The side of the stretchable conductor with the exposed wire was pressed into the non-conductive adhesive and into contact with the conductive fabric. A platen was used to apply pressure between the other side of the stretchable conductor and the other side of the conductive fabric. A pressure of 80 psi (0.55 MPa) was applied while the non-conductive adhesive was cured at 90-100° C. for 5-10 minutes. After the non-conductive adhesive was cured, the electrical resistance between the wire and the conductive fabric was assessed and found to be approximately 2 Ohms.

These samples were then subjected to a wash test to determine if the connection was durable in the face regular clothes washing. The wash test consisted of tumbling the samples in soapy water (using Dawn dishwashing detergent)

for 72 hours in a plastic bottle on rollers, gently rinsing the samples with more water to remove the soap, and drying the samples in a 57° C. (135° F.) oven for 1.5 hours. They were then retested for the electrical connection between the stretchable conductor and the conductive fabric. It was found that the electrical resistance remained approximately 2 Ohms after the wash test.

Example 11

An article having a stretchable conductor bonded to a conductive fabric was prepared generally as described in Example 10, except that a portion of a conductive film commercially available as ACF from 3M Company of St. Paul Minn. was interposed between a portion of conductive fabric and the wire, generally as depicted in FIG. 12B. After the non-conductive adhesive was cured by heat and under pressure, the electrical resistance between the wire and the conductive fabric was assessed and found to be approximately 2 Ohms. As in Example 10, the samples were subjected to a wash test and it was found that the electrical resistance remained approximately 2 Ohms after the wash.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

The invention claimed is:

1. A method of making a stretchable conductor, comprising:
   contacting a winding elongate wire with a surface of a release layer;
   embedding a first portion of a surface area of the wire in the surface of the release layer such that a second portion of the surface area of the wire remains unembedded in the surface of the release layer, wherein the second portion of the surface area of the wire comprises about 1% to about 80% of the total surface area of the wire;
   applying a layer of a liquid elastomeric precursor material onto the surface of the release layer to overlie at least part of the second portion of the surface area of the wire;
   converting the layer of the liquid elastomeric precursor material into a layer of elastomeric material; and
   separating the layer of elastomeric material from the release layer such that the wire separates from the release layer and the second portion of the surface area of the wire remains embedded in the layer of elastomeric material.

2. The method according to claim 1, wherein the surface of the release layer comprises a plurality of parallel depressions.

3. The method of claim 1, wherein applying the layer of a liquid elastomeric precursor material onto the surface of the release layer to overlie the second portion of the surface area of the wire is carried out such that a third portion of the surface area of the wire remains uncovered by the liquid elastomeric precursor.

4. The method of claim 1, further comprising:
   applying a precursor of a non-conductive adhesive to a conductive fabric;
     contacting the second portion of the wire with at least a portion of the conductive fabric; and
     applying a pressure of at least 0.55 MPa while curing the non-conductive adhesive precursor to produce a non-conductive adhesive.

* * * * *

UNITED STATES PATENT AND TRADEMARK OFFICE
CERTIFICATE OF CORRECTION

PATENT NO. : 10,854,355 B2
APPLICATION NO. : 16/621021
DATED : December 1, 2020
INVENTOR(S) : Ankit Mahajan et al.

It is certified that error appears in the above-identified patent and that said Letters Patent is hereby corrected as shown below:

On the Title Page

<u>Item (72)</u>
Delete "Heignts," and insert -- Heights --, therefor.
Delete "Bloomigton," and insert -- Bloomington --, therefor.

In the Specification

<u>Column 5</u>
Line 1, Delete "subassembly," and insert -- subassembly --, therefor.

<u>Column 10</u>
Line 11 (approximately), Delete "FIG. 12A" and insert -- FIG. 12A. --, therefor.

<u>Column 16</u>
Line 44, Delete "copolymers" and insert -- copolymers, --, therefor.

<u>Column 20</u>
Lines 5-6 (approximately), Delete "2-heptadeoylimidazole," and insert -- 2-heptadecylimidazole, --, therefor.
Line 12 (approximately), Delete "isophtholohydrazide," and insert -- isophthalohydrazide, --, therefor.
Line 13 (approximately), Delete "salicylohydrazide," and insert -- salicylhydrazide, --, therefor.
Line 47, Delete "unde-7-ene" and insert -- undec-7-ene --, therefor.

<u>Column 27</u>
Line 36, Delete "inciting" and insert -- melting --, therefor.

<u>Column 35-36</u>
Line 46 (approximately), Delete "Chematics," and insert -- Chemetics, --, therefor.

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*

Column 42
Line 26, Delete "prepared" and insert -- prepared. --, therefor.